US012628373B2

(12) United States Patent
Hell et al.

(10) Patent No.: US 12,628,373 B2
(45) Date of Patent: May 12, 2026

(54) SEMICONDUCTOR DEVICE HAVING A FIELD TERMINATION STRUCTURE AND A CHARGE BALANCE STRUCTURE, AND METHOD OF PRODUCING THE SEMICONDUCTOR DEVICE

(71) Applicant: Infineon Technologies AG, Neubiberg (DE)

(72) Inventors: Michael Hell, Erlangen (DE); Rudolf Elpelt, Erlangen (DE); Frank Hille, Munich (DE); Caspar Leendertz, Munich (DE); Armin Willmeroth, Friedberg (DE)

(73) Assignee: Infineon Technologies AG, Neubiberg (DE)

( * ) Notice: Subject to any disclaimer, the term of this patent is extended or adjusted under 35 U.S.C. 154(b) by 621 days.

(21) Appl. No.: 18/080,427

(22) Filed: Dec. 13, 2022

(65) Prior Publication Data

US 2024/0194778 A1      Jun. 13, 2024

(51) Int. Cl.
*H10D 30/66* (2025.01)
*H01L 21/265* (2006.01)
(Continued)

(52) U.S. Cl.
CPC ..... *H10D 30/665* (2025.01); *H01L 21/26513* (2013.01); *H01L 21/266* (2013.01);
(Continued)

(58) Field of Classification Search
CPC .. H10D 12/481; H10D 30/668; H10D 62/052; H10D 62/058; H10D 62/107; H10D 62/126; H10D 62/393
(Continued)

(56) References Cited

U.S. PATENT DOCUMENTS 7,737,469 B2    6/2010  Saito et al.
9,978,832 B1    5/2018  Martino
(Continued)

FOREIGN PATENT DOCUMENTS

CN          116632037 A      8/2023
DE      102006023598 B3     11/2007
WO        2023071308 A1      5/2023

OTHER PUBLICATIONS

Kimoto, T., et al., "Progress in Ultrahigh-Voltage SiC Devices for Future Power Infrastructure", IEEE, Department of Electronic Science and Eng., Kyoto University, 2014, pp. 36-39.
(Continued)

*Primary Examiner* — Fazli Erdem
(74) *Attorney, Agent, or Firm* — Murphy, Bilak & Homiller, PLLC

(57) ABSTRACT

A semiconductor device includes: a semiconductor substrate having an active device region that includes a plurality of device cells and a termination region between the active device region and an edge of the semiconductor substrate; a field termination structure in the termination region and including a continuous region of a first conductivity type and a plurality of rings of the first conductivity type in the continuous region and having a higher average doping concentration than the continuous region; and a charge balance structure in the active device region and including interleaved columns of the first conductivity type and of a second conductivity type opposite the first conductivity type. The charge balance structure extends into the termination region below the field termination structure such that at least an outermost one of the columns of the first conductivity type is connected to the continuous region of the field termination structure.

23 Claims, 17 Drawing Sheets

(51) Int. Cl.
  *H01L 21/266*     (2006.01)
  *H10D 62/10*     (2025.01)
  *H10D 62/832*     (2025.01)

(52) U.S. Cl.
  CPC ......... *H10D 62/111* (2025.01); *H10D 62/127* (2025.01); *H10D 62/8325* (2025.01)

(58) Field of Classification Search
  USPC ........................................................ 257/341
  See application file for complete search history.

(56)      References Cited

U.S. PATENT DOCUMENTS

| | | | |
|---|---|---|---|
| 10,002,920 | B1 | 6/2018 | Bolotnikov et al. |
| 10,541,325 | B2 | 1/2020 | Elpelt et al. |
| 10,886,397 | B2 * | 1/2021 | Maeta .................. H10D 62/058 |
| 11,145,755 | B2 | 10/2021 | Wehrhahn-Kilian et al. |
| 2003/0222327 | A1 | 12/2003 | Yamaguchi et al. |
| 2007/0272979 | A1 * | 11/2007 | Saito .................... H10D 30/665 |
| | | | 257/E29.328 |
| 2010/0200936 | A1 | 8/2010 | Saito et al. |
| 2019/0131447 | A1 | 5/2019 | Elpelt et al. |
| 2019/0148485 | A1 * | 5/2019 | Hamada ............... H10D 62/111 |
| | | | 257/493 |
| 2019/0165159 | A1 | 5/2019 | Wehrhahn-kilian et al. |
| 2023/0223436 | A1 | 7/2023 | Jo et al. |
| 2023/0246102 | A1 * | 8/2023 | Kumagai .......... H10D 62/8325 |
| | | | 257/341 |
| 2024/0194778 | A1 | 6/2024 | Hell et al. |

OTHER PUBLICATIONS

Kimoto, T., et al., "Ultrahigh-Voltage SiC Bipolar Devices for Future Power Infrastructure", Dept. of Electronic Sci. and Eng., Kyoto University.

Kimoto, Tsunenobu, "Ultrahigh-Voltage SiC Devices for Future Power Infrastructure", IEEE, Department of Electronic Science and Engineering, Kyoto University, 2013, pp. 22-29.

Masuda, Takeyoshi, et al., "Edge Termination Design with Strong Process Robustness for 1.2 kV-class 4H—SiC Super Junction V-groove MOSFETs", Proceedings of the 2020 32nd International Symposium on Power Semiconductor Devices and ICs (ISPSD) Sep. 13-18, 2020, Vienna, Austria, pp. 166-169.

* cited by examiner

A-A'

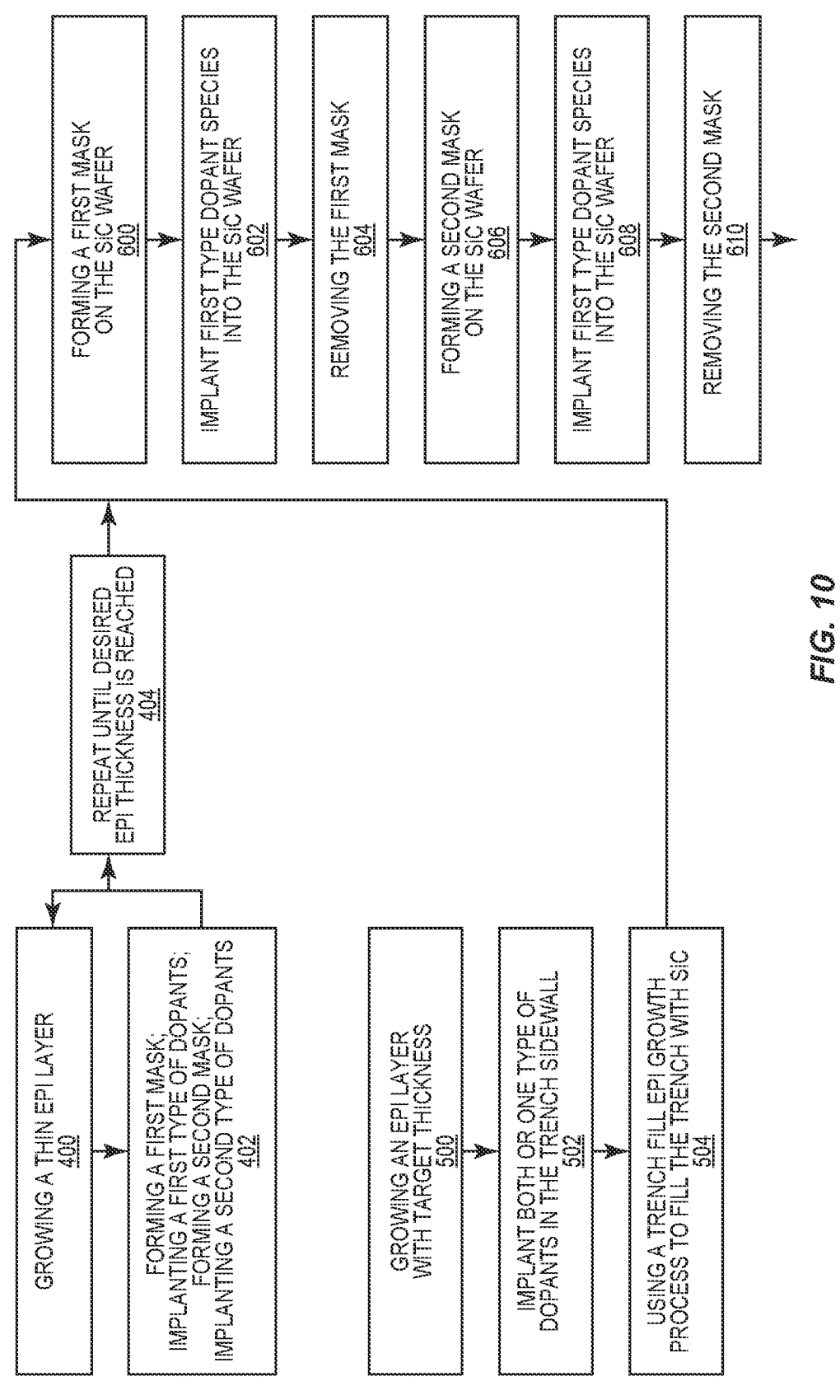

FORMING A FIRST MASK
ON THE SiC WAFER
600

IMPLANT FIRST TYPE DOPANT SPECIES
INTO THE SiC WAFER
602

REMOVING THE FIRST MASK
604

FORMING A SECOND MASK
ON THE SiC WAFER
606

IMPLANT FIRST TYPE DOPANT SPECIES
INTO THE SiC WAFER
608

REMOVING THE SECOND MASK
610

REPEAT UNTIL DESIRED
EPI THICKNESS IS REACHED
404

GROWING A THIN EPI LAYER
400

FORMING A FIRST MASK;
IMPLANTING A FIRST TYPE OF DOPANTS;
FORMING A SECOND MASK;
IMPLANTING A SECOND TYPE OF DOPANTS
402

GROWING AN EPI LAYER
WITH TARGET THICKNESS
500

IMPLANT BOTH OR ONE TYPE OF
DOPANTS IN THE TRENCH SIDEWALL
502

USING A TRENCH FILL EPI GROWTH
PROCESS TO FILL THE TRENCH WITH SiC
504

FIG. 10

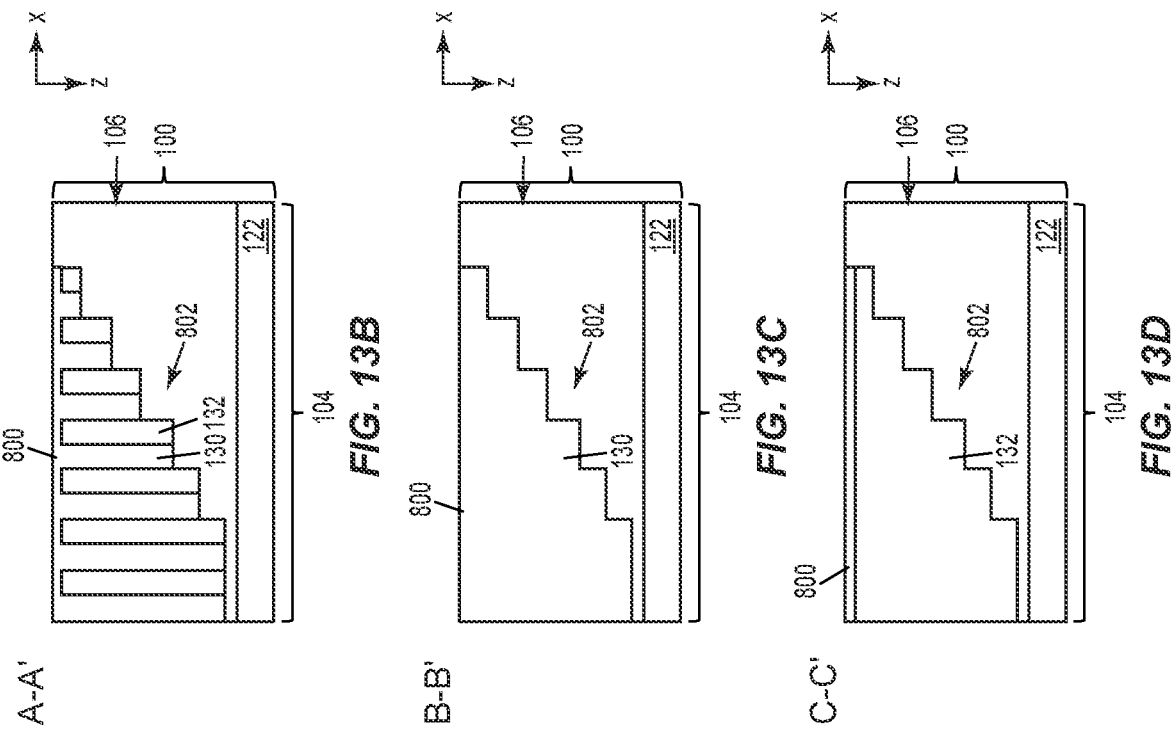
FIG. 13B
FIG. 13C
FIG. 13D
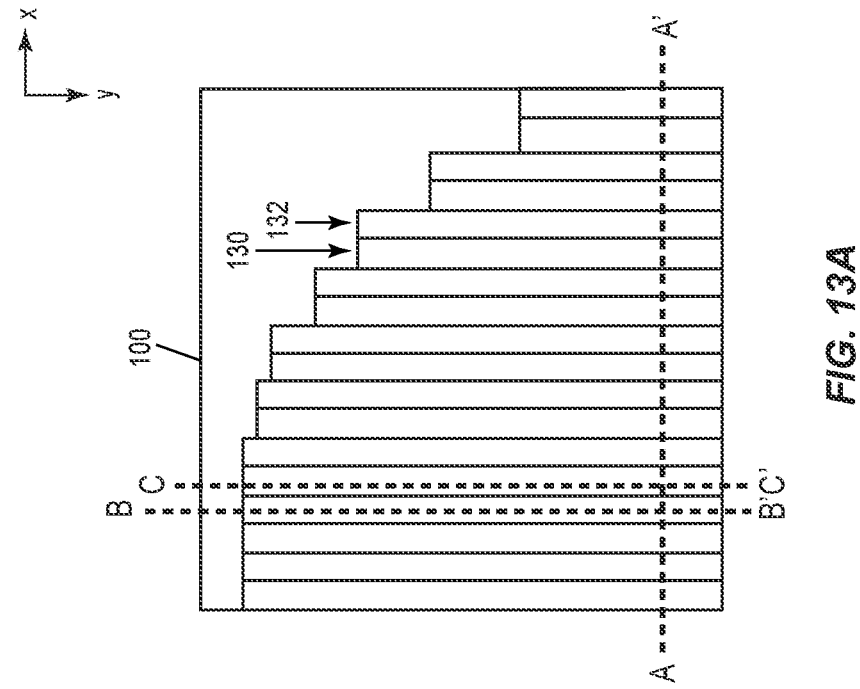
FIG. 13A

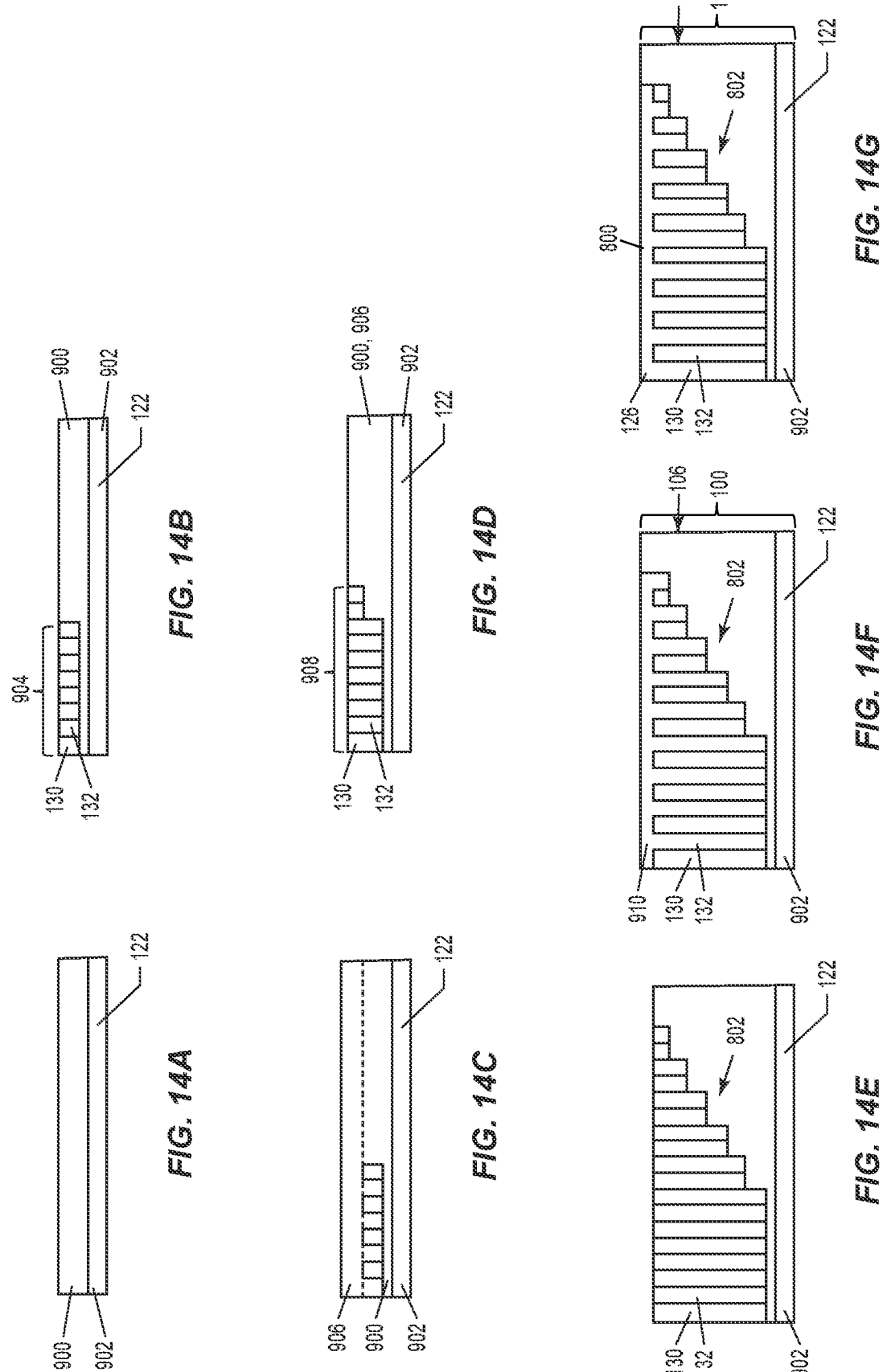

SEMICONDUCTOR DEVICE HAVING A FIELD TERMINATION STRUCTURE AND A CHARGE BALANCE STRUCTURE, AND METHOD OF PRODUCING THE SEMICONDUCTOR DEVICE

BACKGROUND

SiC (silicon carbide) power devices require a suitable edge termination to ensure break down stability. The design of the edge termination is especially challenging for super-junction devices which are based on the idea of charge balancing in the device drift region. Typical superjunction edge termination designs require dimensioning or doping of the superjunction pillars to be different in the cell field where the active device cells reside compared to the termination region which separates the cell field from the chip (die) edge. Such designs locate the breakthrough in the cell field. The manufacturing of this kind of design is especially challenging for SiC devices which requires additional masks and precise mask alignment, or even masks with smaller openings for the termination region. In terms of cost-performance, very high-energy implantations may be used to manufacture SiC superjunction pillars. Accordingly, masks with small openings require very high thickness or even the use of metal as the masking material. Such masks would be extremely expensive and give rise to higher minimal mask openings and higher process variation than typical oxide or even photoresist masks. Therefore, such designs are costly, require careful adjustment for different voltage classes, and suffer from process variations. Other SiC superjunction edge termination solutions require a complicated processing step involving SiC back etch and regrowth.

Thus, there is a need for an improved edge termination design for SiC superjunction devices.

SUMMARY

According to an embodiment of a semiconductor device, the semiconductor device comprises: a semiconductor substrate having an active device region that includes a plurality of device cells and a termination region between the active device region and an edge of the semiconductor substrate; a field termination structure in the termination region and comprising a continuous region of a first conductivity type and a plurality of rings of the first conductivity type in the continuous region and having a higher average doping concentration than the continuous region; and a charge balance structure in the active device region and comprising interleaved columns of the first conductivity type and of a second conductivity type opposite the first conductivity type, wherein the charge balance structure extends into the termination region below the field termination structure such that at least an outermost one of the columns of the first conductivity type is connected to the continuous region of the field termination structure.

According to an embodiment of a method of producing a semiconductor device, the method comprises: forming a plurality of device cells in an active device region of a semiconductor substrate, the semiconductor substrate also having a termination region between the active device region and an edge of the semiconductor substrate; forming a field termination structure in the termination region and comprising a continuous region of a first conductivity type and a plurality of rings of the first conductivity type in the continuous region and having a higher average doping concentration than the continuous region; and forming a charge balance structure in the active device region and comprising interleaved columns of the first conductivity type and of a second conductivity type opposite the first conductivity type, the charge balance structure extending into the termination region below the field termination structure such that at least an outermost one of the columns of the first conductivity type is connected to the continuous region of the field termination structure.

According to another embodiment of a semiconductor device, the semiconductor device comprises: a SiC substrate having an active device region that includes a plurality of device cells and a termination region between the active device region and an edge of the SiC substrate; a junction termination extension of a first conductivity type in the termination region; and a charge balance structure in the active device region and comprising interleaved columns of the first conductivity type and of a second conductivity type opposite the first conductivity type, wherein the charge balance structure extends into the termination region below the junction termination extension, wherein a depth of the interleaved columns of the charge balance structure disposed below the junction termination extension decreases in a horizontal direction heading towards the edge of the SiC substrate.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 10 illustrates a process flow diagram for producing the semiconductor device.

FIG. 13A illustrates a plan view of the staircase-shaped superjunction structure for the semiconductor device of FIG. 12 and in a corner section of the termination region, FIG. 13B illustrates a cross-sectional view along the line labelled A-A' in FIG. 13A, FIG. 13C illustrates a cross-sectional view along the line labelled B-B' in FIG. 13A, and FIG. 13D illustrates a cross-sectional view along the line labelled C-C' in FIG. 13A.

FIGS. 14A through 14G illustrate respective cross-sectional views of the termination region during an embodiment of a process for producing the semiconductor device of FIG. 12.

DETAILED DESCRIPTION

Described herein are semiconductor devices that include both a field termination structure and a superjunction charge balance structure. The field termination structure is disposed in the termination region of the device and ensures break down stability. The superjunction charge balance structure is disposed in the active device region of the device and provides charge balancing via interleaved columns of n-type and p-type semiconductor material. The p-type columns cancel the charge in the surrounding n-type regions under reverse bias, which allows for a thinner and/or more heavily doped drift region. The charge balance structure extends into the termination region below the field termination structure, easing the design requirements for the superjunction columns such as doping concentration, dimensions, etc. The charge balance structure may be identical in both the active device region and termination region which improves manufacturability, but instead may have a different design in the termination region than in the active device region.

Described next with reference to the figures are various embodiments of the integrated field termination structure and superjunction charge balance structure. While the embodiments are described in the context of SiC (silicon carbide) as the base semiconductor material, other types of semiconductors may be used instead of SiC. For example, Si (silicon), GaN (gallium nitride), or $Ga_2O_3$ (gallium oxide) may be used. In the following embodiments, the first conductivity type is p-type and the second conductivity type is n-type for an n-channel device and the first conductivity type is n-type and the second conductivity type is p-type for a p-channel device.

Figure 1:
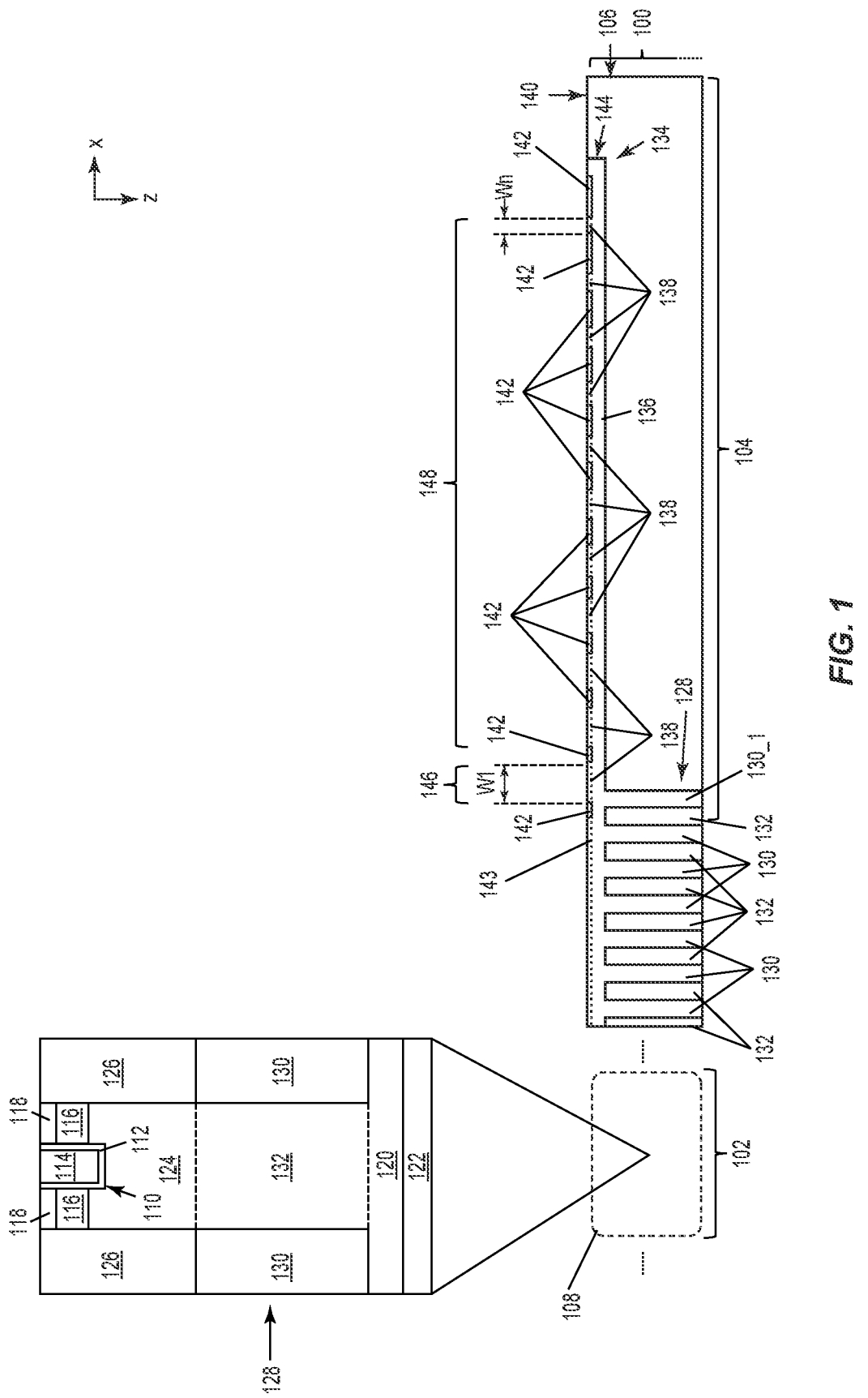
FIG. 1 illustrates a partial cross-sectional view of an embodiment of a semiconductor device that includes both a field termination structure and a superjunction charge balance structure.

FIG. 1 illustrates a partial cross-sectional view of an embodiment of a semiconductor device that includes a SiC substrate 100. The SiC substrate 100 includes a SiC base and one or more SiC epitaxial layers grown on the SiC base. The SiC substrate 100 has an active device region 102 and a termination region 104 between the active device region 102 and the edge 106 of the SiC substrate 100. The active device region 102 includes a plurality of device cells 108. The termination region 104 is devoid of fully functional device cells. In one embodiment, the device cells 108 in the active device region 102 of the SiC substrate 100 are trench gate transistor cells. However, other types of device cells may be used, e.g., such as planar gate transistor cells, diode cells, etc.

FIG. 1 illustrates an example of one trench gate transistor cell which includes a gate trench 110 formed in the SiC substrate 100, a gate dielectric 112 lining the sidewalls and bottom of the gate trench 110, and a gate electrode 114 separated from the SiC substrate 100 by the gate dielectric 112. The semiconductor device may include 10s, 100s, 1000s or even more of these transistor cells to form a power FET (field-effect transistor) such as a MOSFET (metal-oxide-semiconductor FET), JFET (junction FET), FinFET, etc. The semiconductor device instead may be or include a Schottky diode, pn diode, IGBT (insulated gate bipolar transistor), etc.

Each transistor cell in the active device region 102 of the SiC substrate 100 also includes a body region 116 of a first conductivity type and a source region 118 of a second conductivity type opposite the first conductivity type disposed along one or both sidewalls of the gate trench 110. The body region 116 separates the source region 118 from a drift zone 120 of the second conductivity type. A drain region 122 of the second conductivity type adjoins the drift zone 120 at the opposite side of the SiC substrate 100 as the source region 118. A current spread region 124 of the second conductivity type may adjoin the bottom of the gate trench 110. A shielding region 126 of the first conductivity type may laterally adjoin the current spread region 124 and at least partly shield the device cells 108 from a high electric field during operation of the semiconductor device. The shielding region 126 may have a larger doping concentration than the current spread region 124 and may be non-depletable.

The semiconductor device also includes a superjunction (SJ) charge balance structure 128 in the active device region 102 of the SiC substrate 100. The SJ charge balance structure 128 includes interleaved columns 130, 132 of the first and second conductivity types below the gate trenches 110. The SJ column 132 of the second conductivity type is delineated by horizontal lines in FIG. 1 to indicate the position of the SJ column 132 of the second conductivity type relative to the current spread region 124, the drift zone 120 and the SJ column 130 of the first conductivity type. The SJ column 132 of the second conductivity type instead may be integrally formed with the current spread region 124 and/or the drift zone 120, but may have a different doping concentration than the current spread region 124 and/or the drift zone 120.

Charge balance is provided between the oppositely doped semiconductor regions 130, 132 of the SJ charge balance structure 128 to allow for a lower resistance (higher doping) of the drift zone 120 and thus lower RonA (on-state resistance X area) figure of merit. For example, the oppositely doped semiconductor regions 130, 132 of the SJ charge balance structure 128 may have an average doping concentration in a range of $1e16/cm^3$ to $5e17/cm^3$. Charge balance may be achieved by adjusting the lateral dimensions, shape and/or doping concentrations of the oppositely doped columns 130, 132 of the SJ charge balance structure 128. More generally, the SJ charge balance structure 128 enables the device to block its full voltage by balancing additional charge in the drift zone 120 (e.g., n-charge for an n-channel device) by adjacently positioned regions of the opposite conductivity type (e.g., p-type for an n-channel device), allowing for at least two degrees of freedom in setting the on-state resistance and blocking voltage of the device. The doping of shielding region 126 may be different (e.g., higher) than of the SJ columns 130 of the first conductivity type.

The semiconductor device further includes a field termination structure 134 in the termination region 104 of the SiC substrate 100. The field termination structure 134 may be designed to control a well-defined lateral potential drop between the active device region 102 and the termination region 104 in the presence of the SJ columns 130, 132, leading to a potential difference between the front and back sides of the active device region 102 being reduced towards the substrate edge 106 in a controlled manner. Accordingly, the SJ columns 130, 132 in the termination region 104 block a lower potential and the location with the highest electric field and highest impact ionization is shifted to the active device region 102, where the full drain-source potential drops vertically across the drift zone 120. The position of maximum impact ionization may be fixed in the active device region 102 even if the same SJ columns 130, 132 are used in both the active device region 102 and the termination region 104. Furthermore, the typical benefits of the field termination structure 134 such as a large dose window and thus higher process stability and stability against external charges are realized in combination with the SJ charge balance structure 128.

The field termination structure 134 includes a continuous region 136 of the first conductivity type and a plurality of rings 138 of the first conductivity type disposed in the continuous region 136. The field termination rings 138 have the same conductivity type as the continuous region 136 of the field termination structure 134 but a higher average doping concentration than the continuous region 136. The SJ charge balance structure 128 extends into the termination region 104 below the field termination structure 134 such that at least an outermost one 130_1 of the SJ columns 130 of the first conductivity type is connected to the continuous region 136 of the field termination structure 134. More generally, the SJ charge balance structure 128 may terminate in the termination region 104 with a column 130/132 of the first or second conductivity type. The SJ columns 130, 132 of the first and/or second conductivity type in the active device region 102 may have the same or different doping profile as the SJ column(s) 130, 132 of the same conductivity type disposed below the field termination structure 134 in the termination region 104.

The continuous region 136 of the field termination structure 134 electrically connects each SJ column 130 of the first conductivity type in the termination region 104 to the field termination rings 138 of the same (first) conductivity type and which are located closer to the front main surface 140 of the SiC substrate 100 than the SJ columns 130, 132. The field termination rings 138 of the first conductivity type are more highly doped than the continuous region 136 of the field termination structure 134 and the continuous region 136 may have a doping concentration similar to that of the SJ columns 130 of the first conductivity type. Accordingly, the average doping concentration of the field termination rings 138 of the first conductivity type may be greater than the average doping concentration of the SJ columns 130 of the first conductivity type.

The field termination rings 138 of the first conductivity type may be designed such that the ring width (W) and/or average doping concentration of the field termination rings 138 of the first conductivity type decreases in a horizontal direction (x direction in FIG. 1) heading towards the edge 106 of the SiC substrate 100. The lateral gap between the termination rings 138 of the first conductivity type may be filled by the lower-doped continuous region 136 of the same conductivity type, or by rings 142 of the second conductivity type formed in the continuous region 136 and interleaved with the rings 138 of the first conductivity type.

In a horizontal direction (x direction in FIG. 1) towards the active device region 102, a transition region 143 of the first conductivity type may be disposed between the active device region 102 and the termination region 104. The transition region 143 has a higher average doping concentration than both the continuous region 136 of the field termination structure 134 and the SJ columns 130 of the first conductivity type. The SJ charge balancing structure 128 extends below the transition region 143 and into the termination region 104. The SJ columns of the first conductivity type disposed below the transition region 143 are connected to the transition region 143.

If the shielding regions 126 of the first conductivity type form the upper part of the SJ columns 130 of the first conductivity type in the active device region 102 as shown in FIG. 1, then the device shielding regions 126 are omitted in the termination region 104. To do so, a different mask for the superjunction columns 130, 132 may be used in the termination region 104 but only for the upper most epitaxial layer. The device shielding regions 126 of the first conductivity type may extend deeper into the SiC substrate 100 than the field termination rings 138, 142 and may have higher doping concentration than the SJ columns 130 of the first conductivity type, ensuring breakthrough occurs in the active device region 102.

Further design features of the SJ columns 130, 132 in the active device region 102 may be a step function in the doping profile to improve breakdown voltage ruggedness against charge imbalance in the SJ columns 130, 132. Such a step function for the doping profile in the SJ columns 130, 132 also may be used for the portion of the SJ charge balance structure 128 that extends into the termination region 104. A different doping profile may be used for the SJ columns 130, 132 in the active device region 102 than in the termination region 104, such as a gradient in the doping density.

The field termination structure 134 may be used with all kinds of different FET (e.g., MOSFET, FinFET, JFET, etc.), IGBT, or diode top cell structures in the active device region 102. Moreover, the field termination structure 134 may be combined with different SJ column configurations and may be designed to be more rugged in combination with SJ columns 130, 132 that have a reduced width, average doping concentration, and/or height/depth towards the edge 106 of the SiC substrate 100.

In FIG. 1, the continuous region 136 of the field termination structure 134 extends deeper (z direction in FIG. 1) into the SiC substrate 100 than the field termination rings 138 of the first conductivity type. According to this embodiment, the field termination rings 138 of the first conductivity type and the optional field termination rings 142 of the second conductivity type terminate at a shallower depth in the SiC substrate 100 compared to the continuous region 136 of the field termination structure 134 and the continuous region 136 electrically connects each SJ column 130 of the first conductivity type in the termination region 104 to the field termination rings 138 of the first conductivity type.

The SJ charge balance structure 128 may laterally extend only to an inner part of the field termination structure 134. For example, FIG. 1 shows the outermost one 130_1 of the SJ columns 130 of the first conductivity type being laterally separated from the outer edge 144 of the field termination structure 134 by several field termination rings 138 of the first conductivity type.

Figures 2, 3:
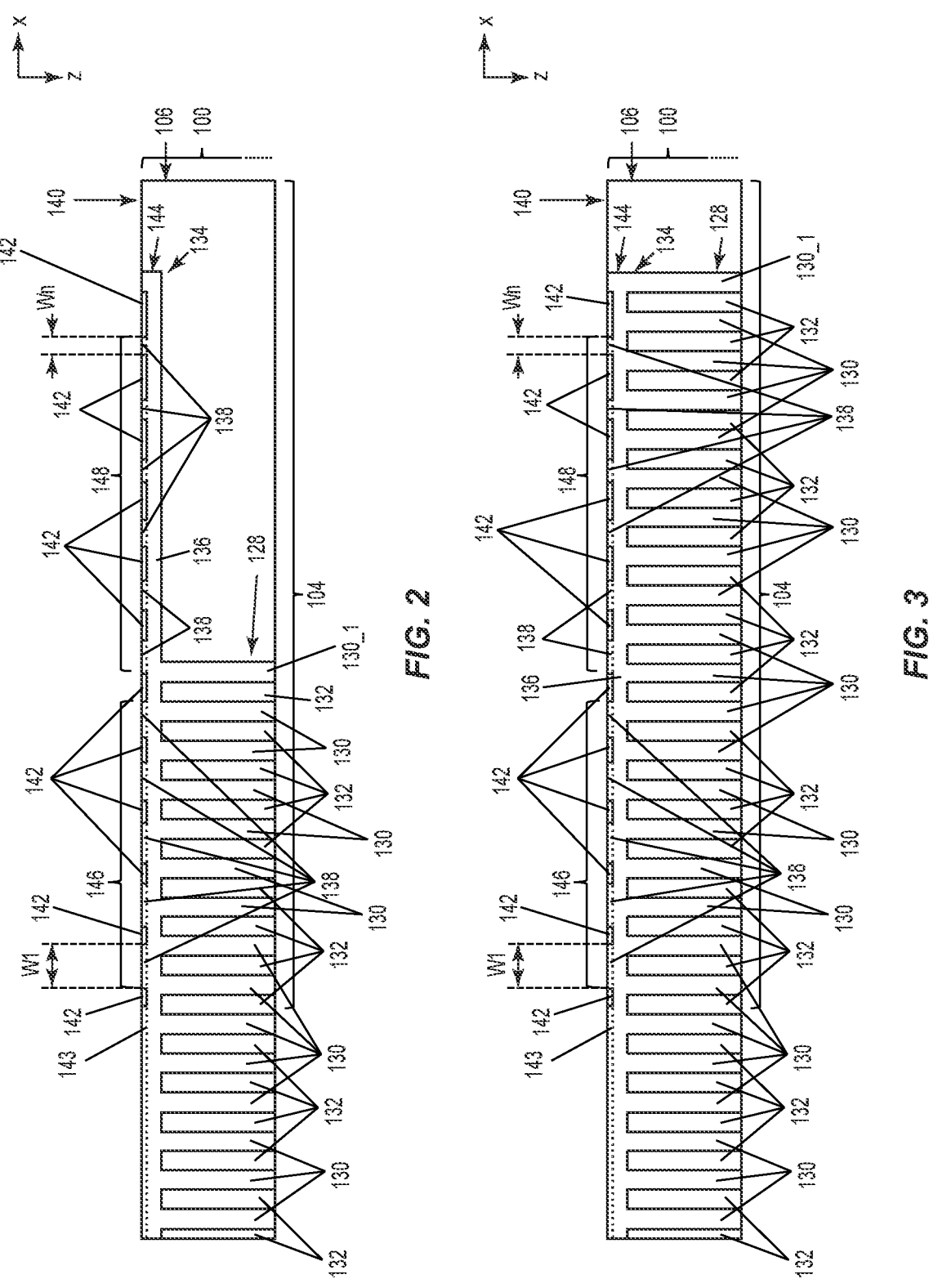
FIG. 2 illustrates a partial cross-sectional view of the semiconductor device, according to another embodiment.
FIG. 3 illustrates a partial cross-sectional view of the semiconductor device, according to another embodiment.

FIG. 2 illustrates a partial cross-sectional view of the semiconductor device, according to another embodiment. In FIG. 2, the outermost one 130_1 of the SJ columns 130 of the first conductivity type is laterally spaced closer to the outer edge 144 of the field termination structure 134 than in FIG. 1. Accordingly, the outermost SJ column 130_1 of the first conductivity type is laterally separated from the outer edge 144 of the field termination structure 134 by fewer field termination rings 138 of the first conductivity type than in FIG. 1 and more than one SJ column 130 of the first conductivity type is electrically connected to the field termination rings 138 of the first conductivity type.

FIG. 3 illustrates a partial cross-sectional view of the semiconductor device, according to another embodiment. In FIG. 3, the outermost SJ column 130_1 of the first conductivity type laterally extends to the outer edge 144 of the field termination structure 134. Accordingly, no field termination rings 138 of the first conductivity type are laterally interposed between the outermost SJ column 130_1 of the first conductivity type and the outer edge 144 of the field termination structure 134 in FIG. 3.

In FIGS. 1 and 2, a first subset 146 of the field termination rings 138 of the first conductivity type is positioned between the active device region 102 and a second subset 148 of the field termination rings 138 of the first conductivity type, the second subset 148 of field termination rings 138 is positioned between the first subset 146 of field termination rings 138 and the edge 106 of the SiC substrate 100, and the SJ charge balancing structure 128 extends into the termination region 104 below the first subset 146 of field termination rings 138 but not below the second subset 148 of field termination rings 138. The first subset 146 of field termination rings 138 may include one or more rings 138 of the first conductivity type and the second subset 148 of field termination rings may include at least two (2) rings 138 of the first conductivity type. In one embodiment, the interleaved columns 130, 132 of the SJ charge balancing structure 128 disposed below the first subset 146 of field termination rings in the termination region 104 have the same spacing and the same vertical and horizontal dimensions as the interleaved columns 130, 132 of the SJ charge balancing structure 128 disposed in the active device region 102. In FIG. 3, the SJ charge balancing structure 128 extends into the termination region 104 below all field termination rings 138 of the first conductivity type.

Figure 4A:
FIG. 4A illustrates a plan view of the semiconductor device in a corner section of the termination region of the device.
Figure 4B:
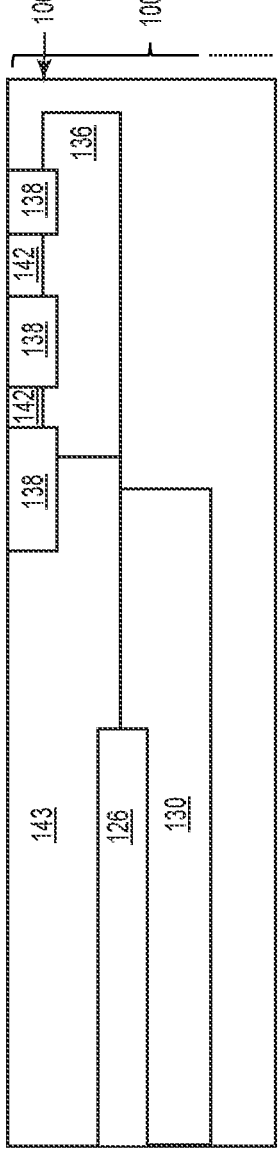
FIG. 4B illustrates a cross-sectional view along the line labelled A-A' in FIG. 4A.
Figure 4C:
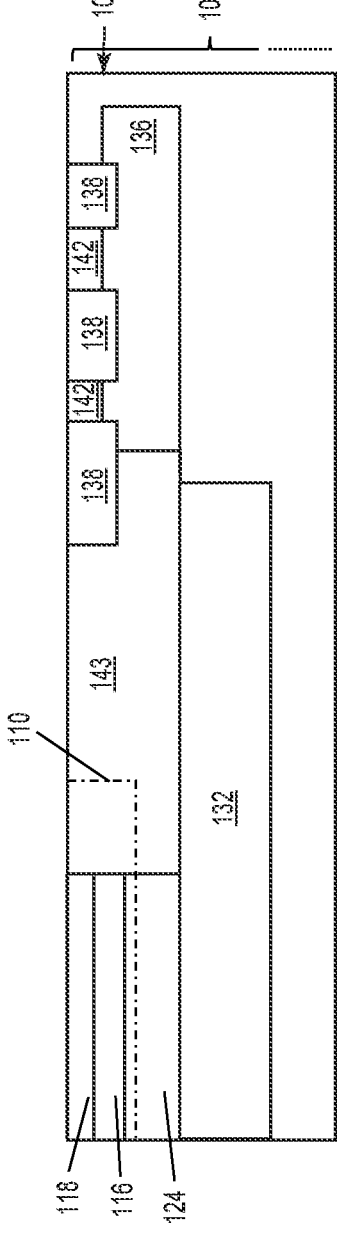
FIG. 4C illustrates a cross-sectional view along the line labelled B-B' in FIG. 4A.
Figure 4D:
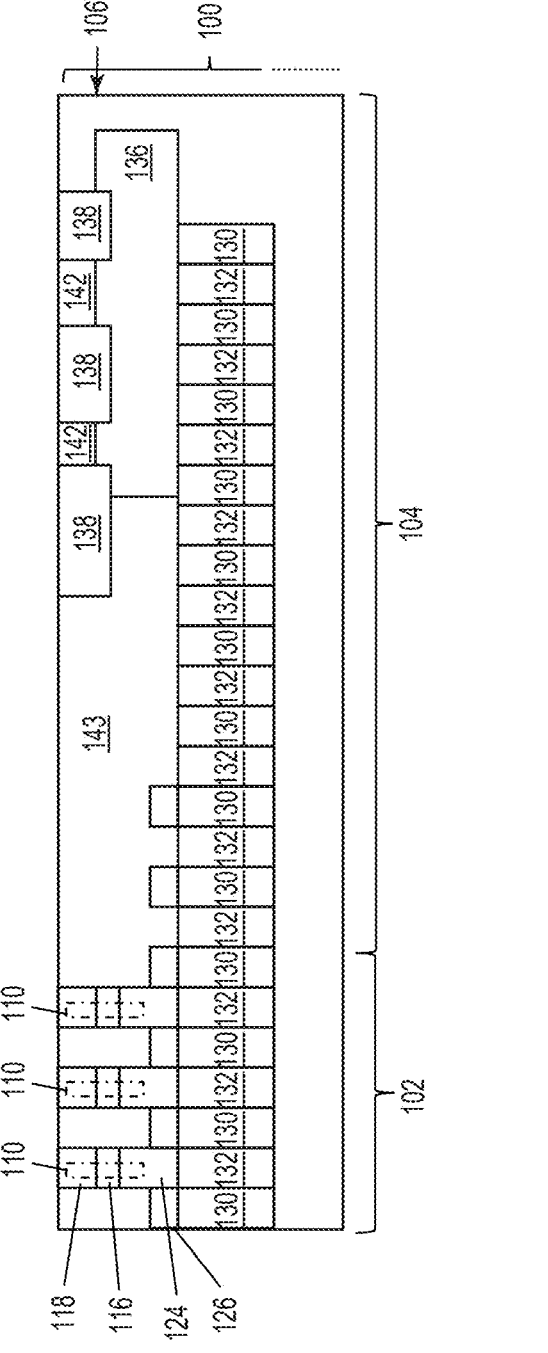
FIG. 4D illustrates a cross-sectional view along the line labelled C-C' in FIG. 4A.

FIG. 4A illustrates a plan view of the semiconductor device in a corner section of the termination region 104 of the SiC substrate 100. FIG. 4B illustrates a cross-sectional view along the line labelled A-A' in FIG. 4A, FIG. 4C illustrates a cross-sectional view along the line labelled B-B' in FIG. 4A, and FIG. 4D illustrates a cross-sectional view along the line labelled C-C' in FIG. 4A. For a first rectilinear part 200 of the termination region 104, the interleaved columns 130, 132 of the SJ charge balance structure 128 run parallel (e.g., along the x direction in FIG. 4A) to the rings 138, 142 of the field termination structure 134. For a second rectilinear part 202 of the termination region 104, the interleaved columns 130, 132 of the SJ charge balance structure 128 run transverse (e.g., along the x direction in FIG. 4A) to the rings 138, 142 of the field termination structure 134. A corner part 204 of the termination region 104 connects the first and second rectilinear parts 200, 202. The number of rings 138 of the first conductivity type and the number of rings 142 of the second conductivity type shown in FIGS. 4B through 4D do not match the number of rings 138 of the first conductivity type and the number of rings 142 of the second conductivity type shown in FIG. 4A, respectively, to emphasize that neither the number of rings 138 of the first conductivity type nor the number of rings 142 of the second conductivity type is limiting and may be chosen as desired.

Figure 5:
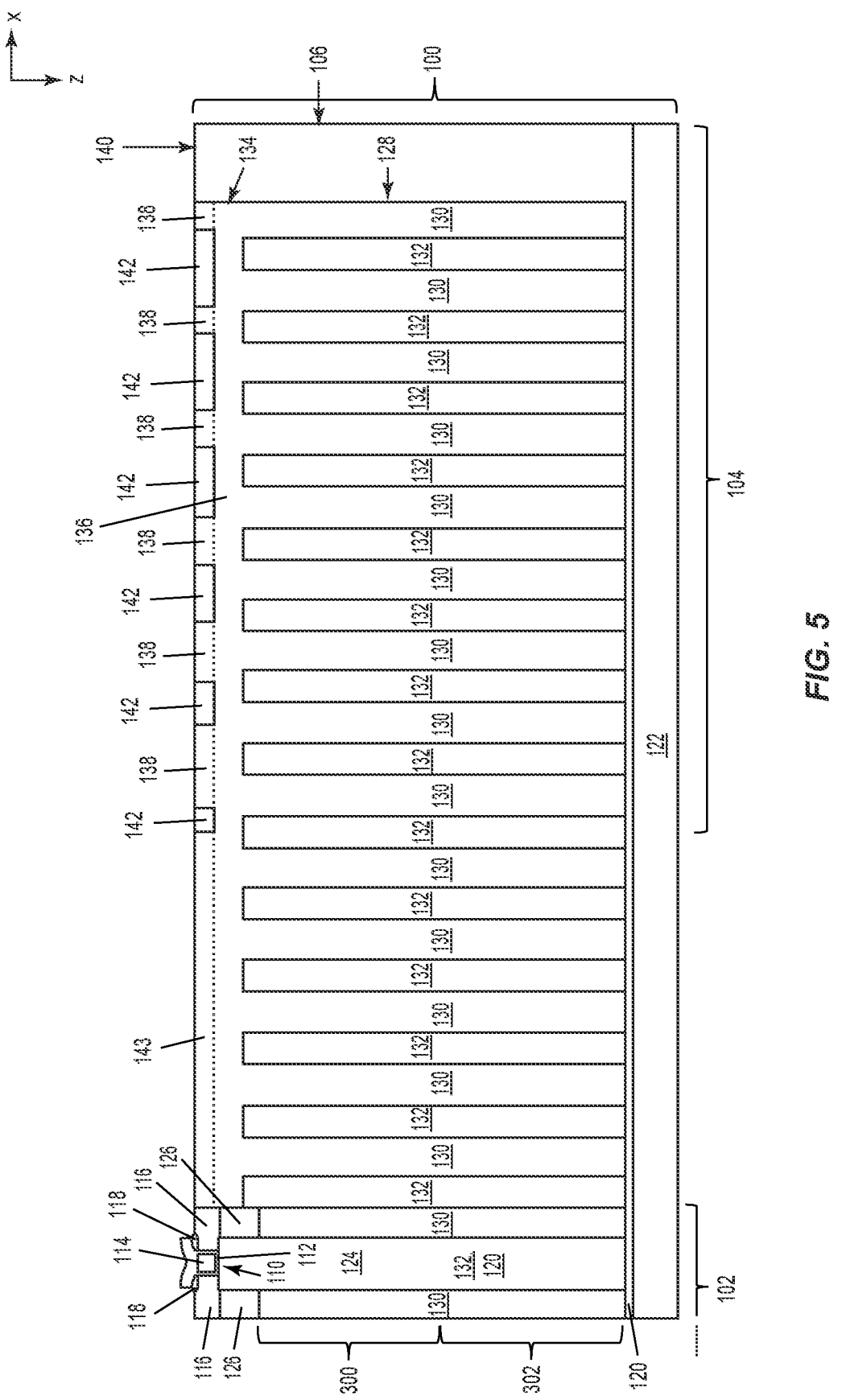
FIG. 5 illustrates a partial cross-sectional view of the semiconductor device, according to another embodiment.

FIG. 5 illustrates a partial cross-sectional view of the semiconductor device, according to another embodiment. In FIG. 5, the net doping (over one SJ pitch) is of (slight) p-type in an upper part 300 of the SJ charge balancing structure 128 and of n-type in a lower part 302 of the SJ charge balancing structure 128. An alternative embodiment is that the SJ columns 132 of the second conductivity type have a constant doping but the upper part of the SJ columns 130 of the first conductivity type are more lightly doped than the lower part. Accordingly, an upper part of the SJ columns 130 of the first conductivity type may be doped more heavily than an adjacent upper part of the SJ columns 132 of the second conductivity type and a lower part of the SJ columns 130 of the first conductivity type may be doped more lightly than an adjacent lower part of the SJ columns 132 of the second conductivity type.

Figure 6:
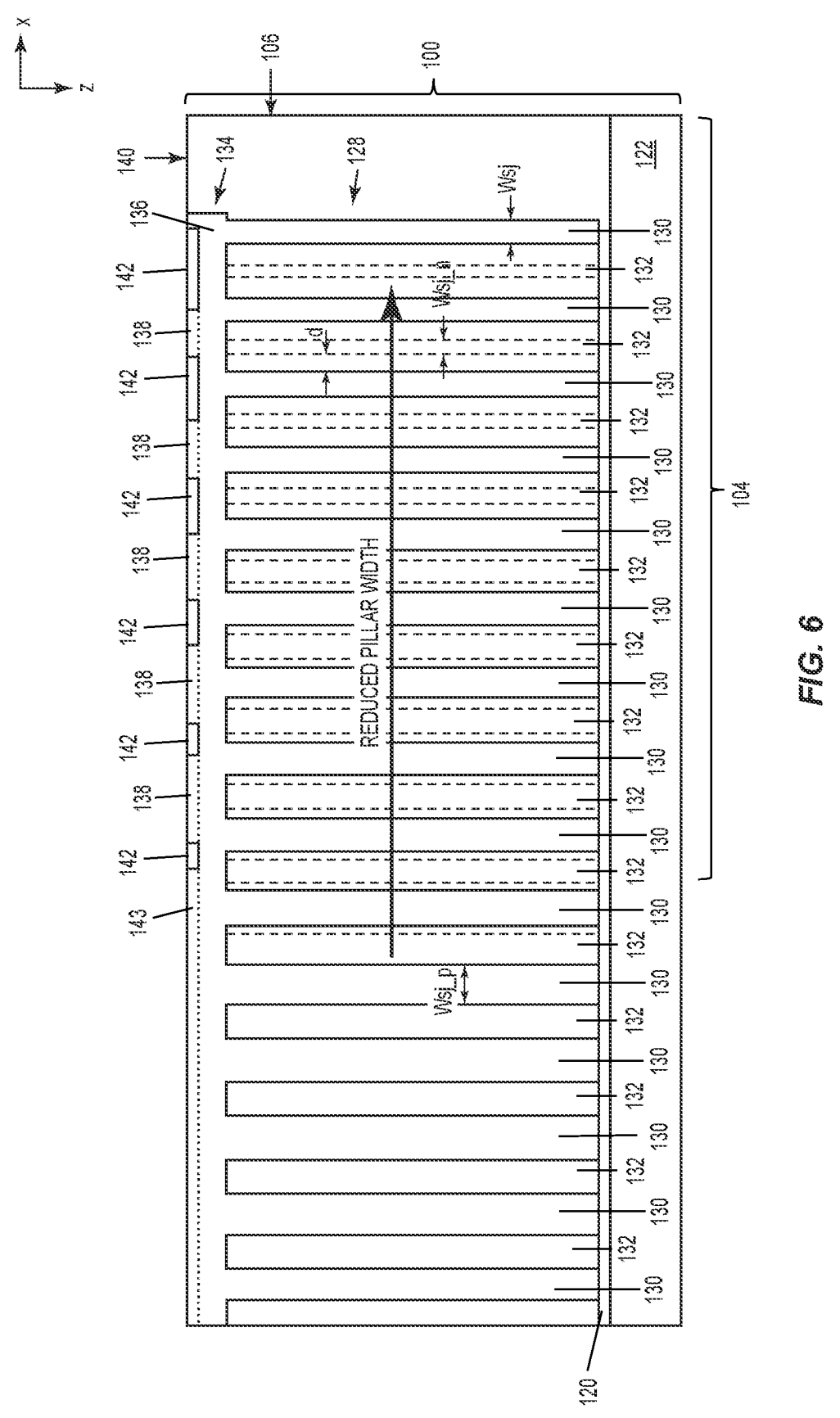
FIG. 6 illustrates a partial cross-sectional view of the semiconductor device, according to another embodiment.

FIG. 6 illustrates a partial cross-sectional view of the semiconductor device, according to another embodiment. In FIG. 6, a width (Wsj_p) of the SJ columns 130 of the first conductivity type disposed below field termination structure 134 decreases in a horizontal direction (x direction in FIG. 6) heading towards the edge 106 of the SiC substrate 100. The width (Wsj_n) of the neighboring SJ columns 132 of the second conductivity type decreases by the same amount in the same horizontal direction. In this way, a space d between the SJ columns 130 of increasing width is created. This region may have a doping concentration that is much lower than that of the SJ columns 132 of the second conductivity type.

Figure 7:
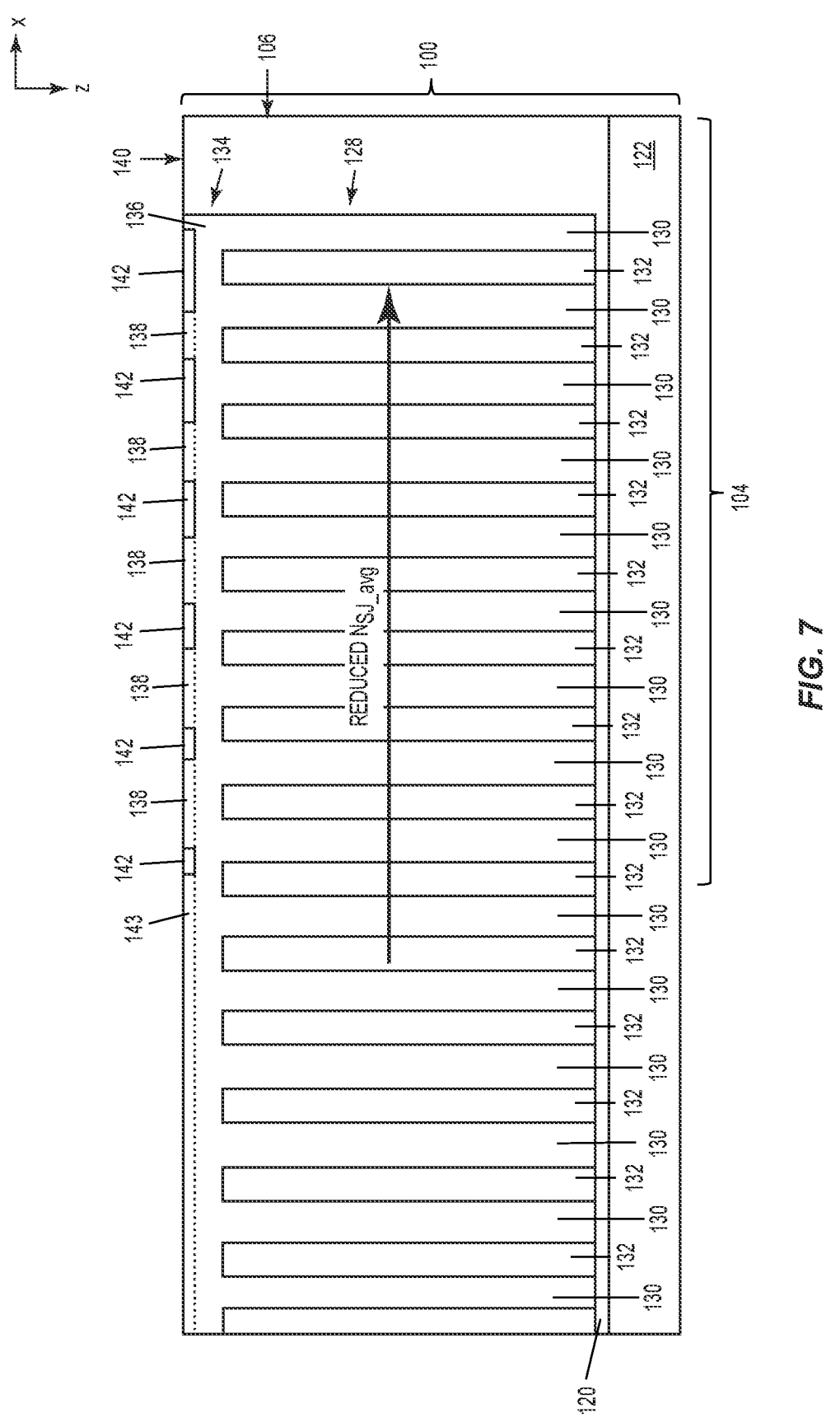
FIG. 7 illustrates a partial cross-sectional view of the semiconductor device, according to another embodiment.

FIG. 7 illustrates a partial cross-sectional view of the semiconductor device, according to another embodiment. In FIG. 7, the average doping concentration ($N_{SJ\_avg}$) of the SJ columns 130 of the first conductivity type disposed below field termination structure 134 decreases in a horizontal direction (x direction in FIG. 6) heading towards the edge 106 of the SiC substrate 100. The average doping concentration of the SJ columns 132 of the second conductivity type may also decrease proportionally in the same horizontal direction.

Figure 8:
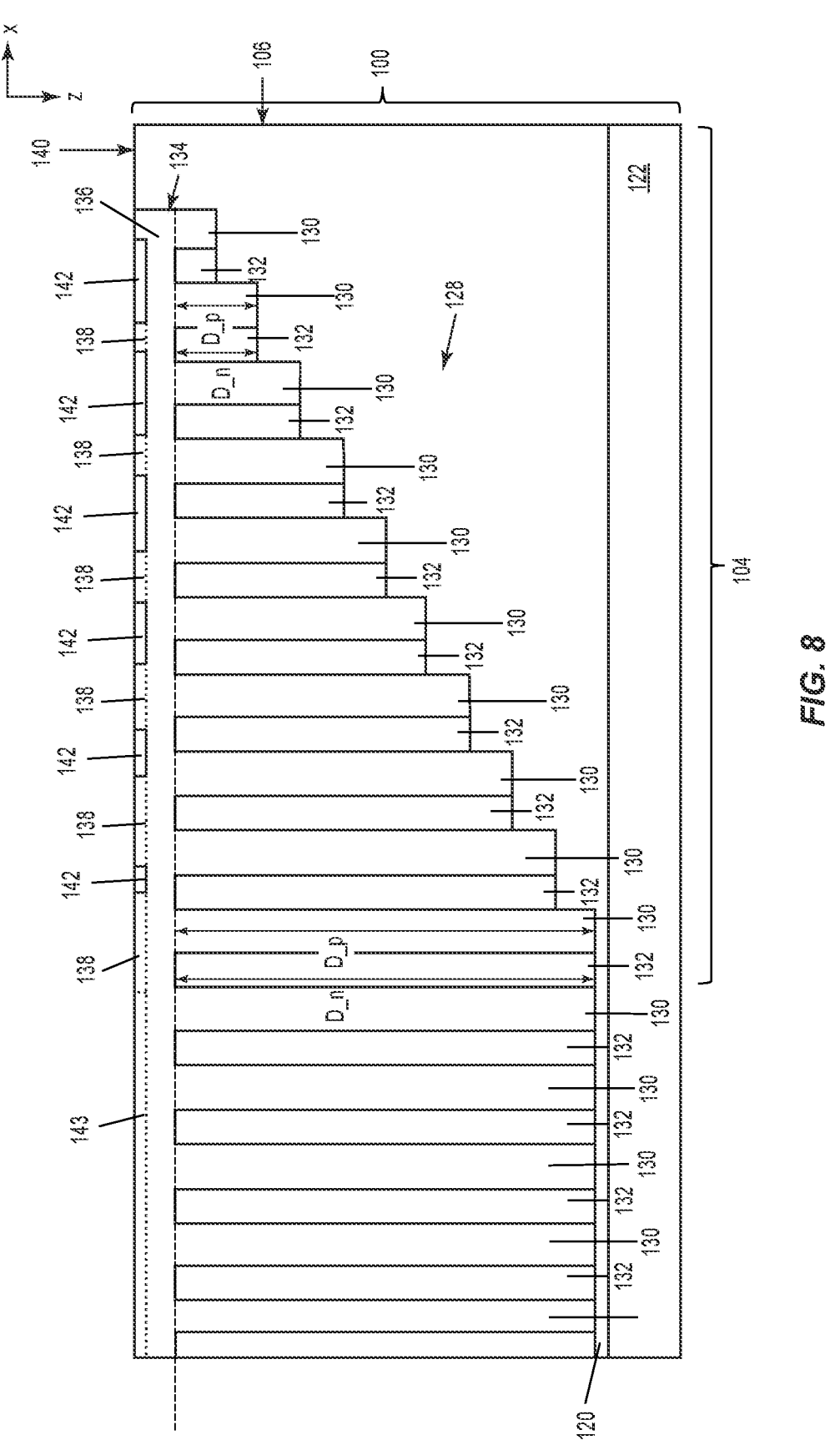
FIG. 8 illustrates a partial cross-sectional view of the semiconductor device, according to another embodiment.

FIG. 8 illustrates a partial cross-sectional view of the semiconductor device, according to another embodiment. In FIG. 8, the depth (D_p) in the z direction of the SJ columns 130 of the first conductivity type disposed below the field termination structure 134 decreases in a horizontal direction (x direction in FIG. 8) heading towards the edge 106 of the SiC substrate 100. The depth (D_n) of the SJ columns 132 of the second conductivity type may also decrease proportionally in the same horizontal direction.

Figure 9:
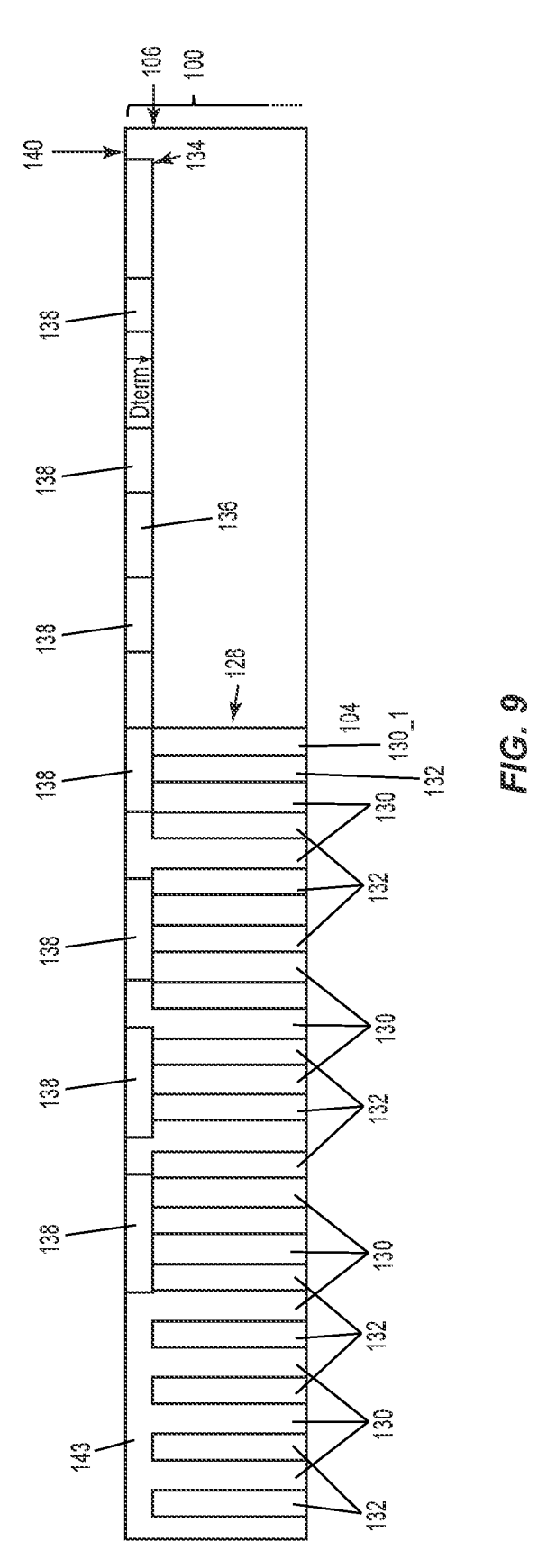
FIG. 9 illustrates a partial cross-sectional view of the semiconductor device, according to another embodiment.

FIG. 9 illustrates a partial cross-sectional view of the semiconductor device, according to another embodiment. In FIG. 9, the continuous region 136 and the rings 138 of the first conductivity type of the field termination structure 134 terminate at the same depth 'Dterm' in the SiC substrate 100. According to this embodiment, rings 142 of the second conductivity type are omitted from the field termination structure 134 so that the continuous region 136 provides an electrical connection between the SJ columns 130 of the first conductivity type in the termination region 104 and the field termination rings 138 of the first conductivity type.

FIG. 10 illustrates a process flow diagram for producing the semiconductor device. The lefthand side of FIG. 10 illustrates two (2) options for forming the SJ charge balance structure 128. The first option involves growing a thin epitaxial ('epi') layer on a SiC wafer (Block 400). A first mask is formed on the thin epitaxial layer, dopants of the first conductivity type are implanted into the thin epitaxial layer through openings in the first mask, the first mask is removed, a second mask is then formed on the thin epitaxial layer, and dopants of the second conductivity type are implanted into the thin epitaxial layer through openings in the second mask (Block 402). The sequence of steps in Blocks 400 and 402 is repeated until a desired final epitaxial thickness is achieved (Block 404). The second option for forming the SJ charge balance structure 128 involves growing a single epitaxial layer having the desired final epi thickness (Block 500), forming trenches in the epitaxial layer and implanting dopants of one or both conductivity types into the sidewalls of the trenches (Block 502), and using a trench fill epi growth process to fill the trenches with SiC (Block 504). Still other options may be used to form the SJ charge balance structure 128.

The righthand side of FIG. 10 illustrates an embodiment for forming the field termination structure 134 in the termination region 104 of each die (chip) produced from a SiC wafer 700. FIGS. 11A through 11G illustrate respective partial cross-sectional views of the SiC wafer 700 in the termination region 104 of one die during different stages of producing the field termination structure 134.

Figures 11A, 11B, 11C, 11D, 11E, 11F, 11G:
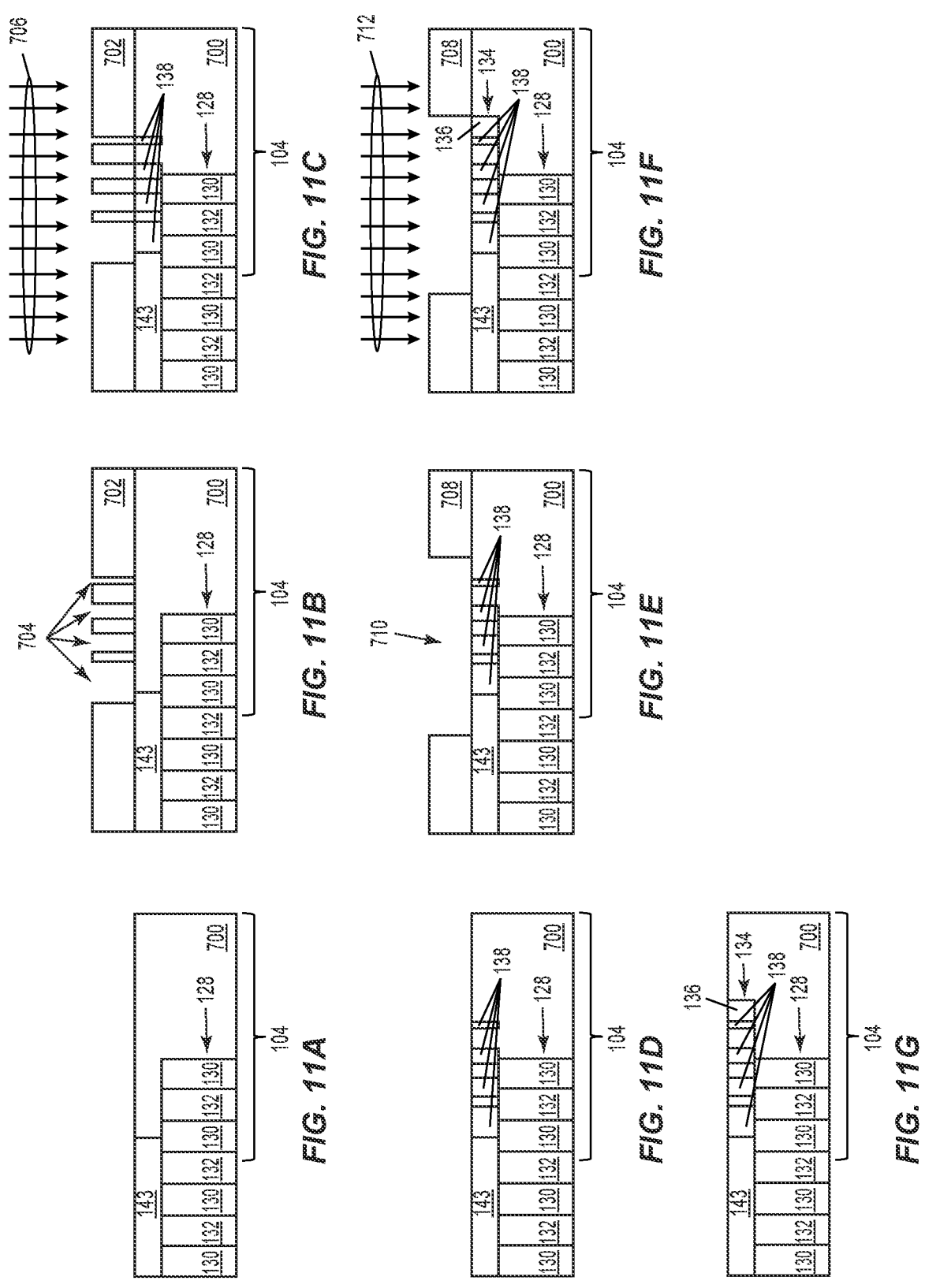
FIGS. 11A through 11G illustrate respective partial cross-sectional views of a SiC wafer in the termination region of one die during different stages of producing the field termination structure according to the method of FIG. 10.

FIG. 11A shows the SiC wafer 700 after the SJ charge balance structure 128 is formed and before forming the field termination structure 134.

FIG. 11B shows a first mask 702 such as a hard mask, photoresist, etc. formed on the SiC wafer 700 (Block 600, FIG. 10). The first mask 702 has openings 704 that define the location of the field termination rings 138 of the first conductivity type in the termination region 104 of each die.

FIG. 11C shows one or more dopant species 706 of the first conductivity type being implanted into the SiC wafer 700 through the openings 704 in the first mask 700 to form the field termination rings 138 of the first conductivity type in the termination region 104 of each die (Block 602, FIG. 10). In the case of SiC as the wafer material, the dopant species 706 of the first conductivity type may include Al, B and/or Ga ions in the case of an n-channel device or N, P and/or As ions in the case of a p-channel device. In the case of Si as the wafer material, the dopant species 706 of the first conductivity type may include B, In and/or Al ions in the case of an n-channel device or As, P and/or Sb ions in the case of a p-channel device.

FIG. 11D shows the SiC wafer 700 after removal of the first mask 702 (Block 604, FIG. 10).

FIG. 11E shows a second mask 708 such as a hard mask, photoresist, etc. formed on the SiC wafer 700 (Block 606, FIG. 10). The second mask 708 has an opening 710 that defines the location of the continuous region 136 of the first conductivity type of the field termination structure 134 in the termination region 104 of each die.

FIG. 11F shows one or more dopant species 712 of the first conductivity type being implanted into the SiC wafer 700 through the opening 710 in the second mask 708 to form the continuous region 136 of the field termination structure 134 in the termination region 104 of each die (Block 608, FIG. 10). The dopant species 712 that forms the continuous region 136 of the field termination structure 134 is implanted at a lower dose than the dopant species 706 that forms the field termination rings 138 of the first conductivity type such that the continuous region 136 has a lower average doping concentration compared to the field termination rings 138 of the first conductivity type. The continuous region 136 and the rings 138 of the first conductivity type of the field termination structure 134 may terminate at the same depth in the SiC wafer 700 or the continuous region 136 may extend deeper into the SiC wafer 700 than the rings 138 of the first conductivity type, depending on the doping parameters such as dopant species, implant energy, etc. The order of the implantation steps shown in FIGS. 11C and 11F may be reversed such that the continuous region 136 of the field termination structure 134 is formed before the field termination rings 138 of the first conductivity type.

FIG. 11G shows the SiC wafer 700 after removal of the second mask 708 (Block 610, FIG. 10).

The method used to produce the field termination structure 134 may include additional masking and dopant implantation steps, e.g., to form the field termination rings 142 of the second conductivity type interleaved with the field termination rings 138 of the first conductivity type in the continuous region 136 of the field termination structure 134. Alternatively, the energy of the implantation for forming the continuous region 136 may be chosen such that the net doping of the field termination rings 142 of the second conductivity type interleaved with the field termination rings 138 of the first conductivity type remains of the same conductivity type as the epitaxial layer near the upper surface of the SiC wafer 700. The field termination rings 142 of the second conductivity type thus may be of the second conductivity type, without additional implantation steps.

Figure 12:
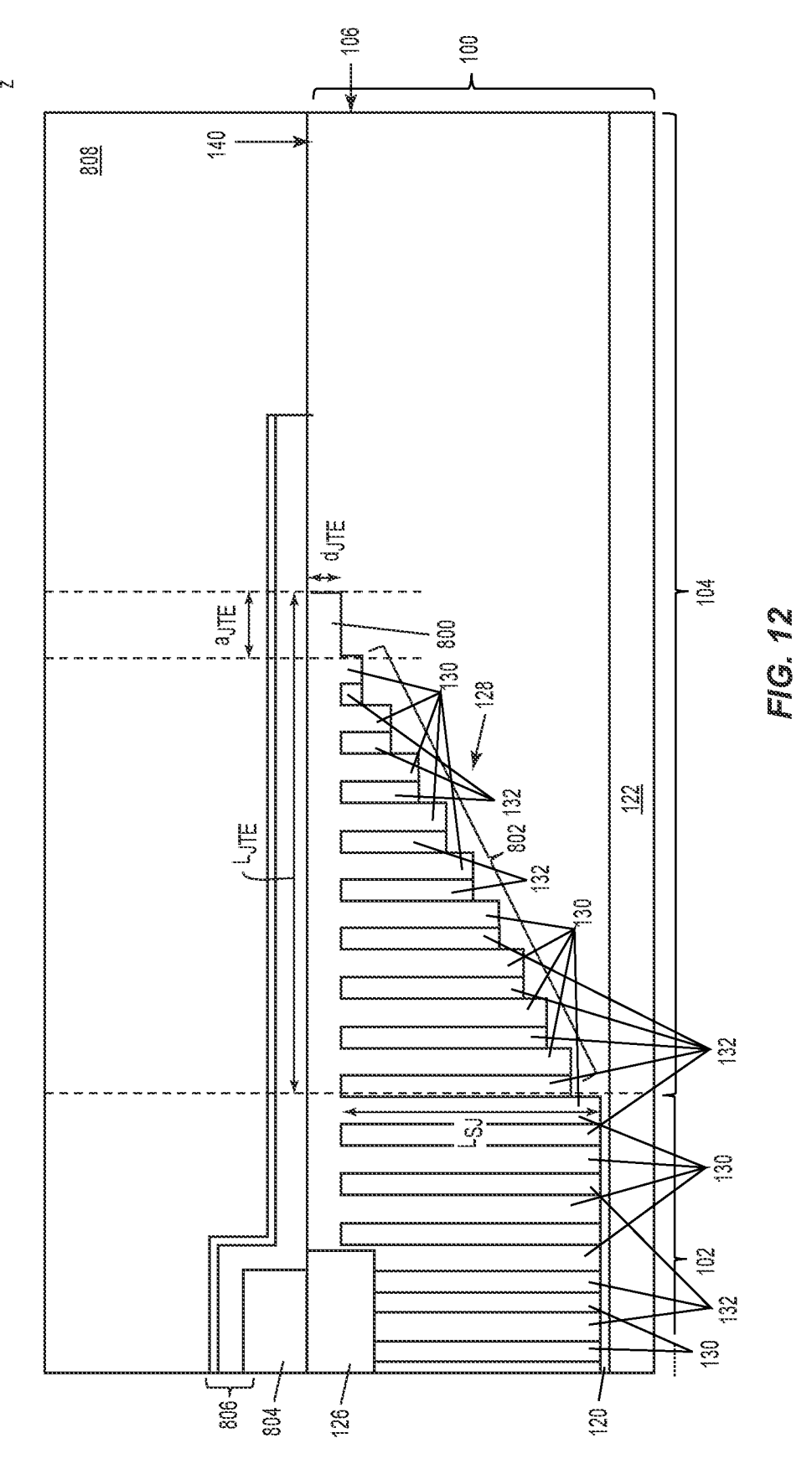
FIG. 12 illustrates a partial cross-sectional view of an embodiment of a semiconductor device that includes both a junction termination extension and a staircase-shaped superjunction structure in the edge termination region of the device.

FIG. 12 illustrates a partial cross-sectional view of another embodiment of a semiconductor device that includes the SJ charge balance structure 128 but a different type of field termination structure in the termination region 104 of the SiC substrate 100.

Instead of the field termination structure 134 described in connection with FIGS. 1 through 11, the semiconductor device shown in FIG. 12 has a junction termination extension 800 of the first conductivity type in the termination region 104 of the SiC substrate 100. The junction termination extension 800 is connected to the shielding regions 126 of the first conductivity type in the active device region 102 and provides precise control of depletion region charge in the junction termination, enabling very high breakdown voltages with very low leakage current.

The SJ charge balance structure 128 in the active device region 102 extends into the termination region 104 below the junction termination extension 800. The height/depth $(L_{SJ})$ of the interleaved columns 130, 132 of the SJ charge balancing structure 128 disposed below the junction termination extension 800 in the termination region 104 decreases in a horizontal direction (x direction in FIG. 12) heading towards the edge 106 of the SiC substrate 100 to form a sort of staircase-shaped structure 802. The junction termination extension 800 has a length '$L_{JTE}$' in the termination region 104, has a depth '$d_{JTE}$' measured from the front main surface 140 of the SiC substrate 100, and may laterally extend beyond the last column 130/132 of the SJ charge balancing structure 128 by a distance '$a_{JTE}$'.

The SJ columns 130, 132 may extend depth-wise (z direction in FIG. 12) down close to the bottom of the drift zone 120 included in the SiC substrate 100. In the termination region 104, the junction termination extension 800 is connected to the SJ columns 130, 132. The doping of the SJ columns 130, 132 in the active device region 102 and the termination region 104 may be the same or different, as previously described herein. The average doping concentration of the junction termination extension 800 may be similar but not exactly the same as that of the SJ columns 130, 132. The active device region 102 may include a MOSFET, JFET, Schottky diode, pn diode, IGBT, etc.

A metal contact 804 to the device shielding regions 126 of the first conductivity type may terminate before extending into the termination region 104 where the SJ staircase structure 802 is located. Accordingly, the junction termination extension 800 of the first conductivity type is not on held on source potential and the potential instead drops laterally across the junction termination extension 800 in the termination region 104 which also alters the electrical field distribution in the SJ columns 130, 132 and thus the functioning and blocking stability of the edge-termination design illustrated in FIG. 12.

The metal contact and junction termination extension 800 may be covered by a passivation 806 such as an oxide and/or nitride covered by imide. An encapsulant 808 such as imide, gel, mold compound, etc. may cover the entire top side of the semiconductor device.

The SJ staircase structure 802 in the termination region 104 of the SiC substrate 100 improves the blocking capability of the device. Also, a simpler junction termination design may be utilized which leads to a seamless integration of the formation of the SJ staircase structure 802 into the fabrication process in that the SJ columns 130, 132 may be based on a multiple epi growth process without any further processing steps, e.g., as illustrated in the upper lefthand part of FIG. 10. The SJ staircase structure 802 in the termination region 104 also helps to reduce passive losses in the termination region 104 of the device. For example, in Si-based SJ devices, the termination region 104 plays an important role for passive losses during switching because the charge stored in the termination region 104 must be ejected from or injected into the device, which is particularly important for long paths in the termination region 104. The SJ staircase structure 802 in the termination region 104 should also reduce Qoss (drain-source charge) for SiC-based devices.

FIG. 13A illustrates a plan view of the SJ charge balancing structure 128 for the semiconductor device of FIG. 12, in a corner section of the termination region 104 of the SiC substrate 100. FIG. 13B illustrates a cross-sectional view along the line labelled A-A' in FIG. 13A, FIG. 13C illustrates a cross-sectional view along the line labelled B-B' in FIG. 13A, and FIG. 13D illustrates a cross-sectional view along the line labelled C-C' in FIG. 13A. Electric field crowding is avoided and charge balance is achieved in the corner section by using the staircase design for the SJ columns 130, 132 of both conductivity types.

FIGS. 14A through 14G illustrate respective cross-sectional views of the termination region 104 of the SiC substrate 100 during an embodiment of a process for producing the semiconductor device of FIG. 12.

FIG. 14A shows the SiC substrate 100 after growth of a first epitaxial layer 900 on a SiC base 902.

FIG. 14B shows the SiC substrate 100 after the lowermost part 904 of the deepest SJ columns 130, 132 of the charge balancing structure 128 are formed in the termination region 104, e.g., by dopant implantation. With the staircase design, the deepest part of the progressively shallower SJ columns are not formed in the first epitaxial layer 900.

FIG. 14C shows the SiC substrate 100 after growth of a second epitaxial layer 906 on the first epitaxial layer 900.

FIG. 14D shows the SiC substrate 100 after the next lower part 908 of the two deepest sets of SJ columns 130, 132 of the charge balancing structure 128 are formed in the termination region 104, e.g., by dopant implantation. With the staircase design, the deepest part of the progressively shallower SJ columns are not formed in the second epitaxial layer 900. The process continues until the desired staircase-shaped SJ structure 802 is formed in the termination region 104.

FIG. 14E shows the SiC substrate 100 after completion of the staircase-shaped SJ structure 802 in the termination region 104.

FIG. 14F shows the SiC substrate 100 after growth of the uppermost epitaxial layer 910.

FIG. 14G shows the SiC substrate 100 after formation of the device shielding region 126 and the junction termination extension 800 of the first conductivity type in the uppermost epitaxial layer 910, e.g., by dopant implantation.

In the case of SiC as the semiconductor material, the SJ columns 130, 132 are formed by implantation. The formation of staircase-shaped SJ structure 802 may involve several epi-growth steps, e.g., as shown in FIGS. 14A through 14E, and in which the full SJ column length is built up over more than one epitaxial layer. After the first epi-growth step shown in FIG. 14A, the lowermost group 904 of SJ column segments is implanted into the otherwise lowly doped epitaxial layer 900. After the second epi-growth step shown in FIG. 14C, the number of implanted SJ column segments 908 is increased towards the edge 108 of the SiC substrate 100. These outermost segments will then form the lower end of the first SJ columns 130, 132 with reduced length. Similarly, the length of the segments along the SJ columns 130, 132 of the same conductivity type is adjusted to form the staircase as illustrated in FIGS. 13A through 13D. This process is repeated until the formation of the SJ columns 130, 132 is completed, as shown in FIG. 14E. After the final epi-growth step shown in FIG. 14F, the device shielding region 126 and the junction termination extension 800 are formed by subsequent processing steps.

The step heights of the staircase-shaped SJ structure 802 depend on the epi-layer thickness, which is set by the maximally feasible implantation depth. The epitaxial layers may be grown as thick as possible to reduce costs. Thus, a SJ staircase edge-termination design is especially easy to implement if the maximum possible epi-layer thickness is small. However, for larger epi-layer thicknesses, such as for larger implantation energies, intermediate step heights may be realized by block-out masks which limits the implantation energy for some of the outer (shorter) SJ columns 130, 132.

FIGS. 15A through 15F illustrate respective cross-sectional views of additional embodiments of the staircase-shaped SJ structure 802 in the termination region 104 of the SiC substrate 100.

Figures 15A, 15B, 15C, 15D, 15E, 15F:
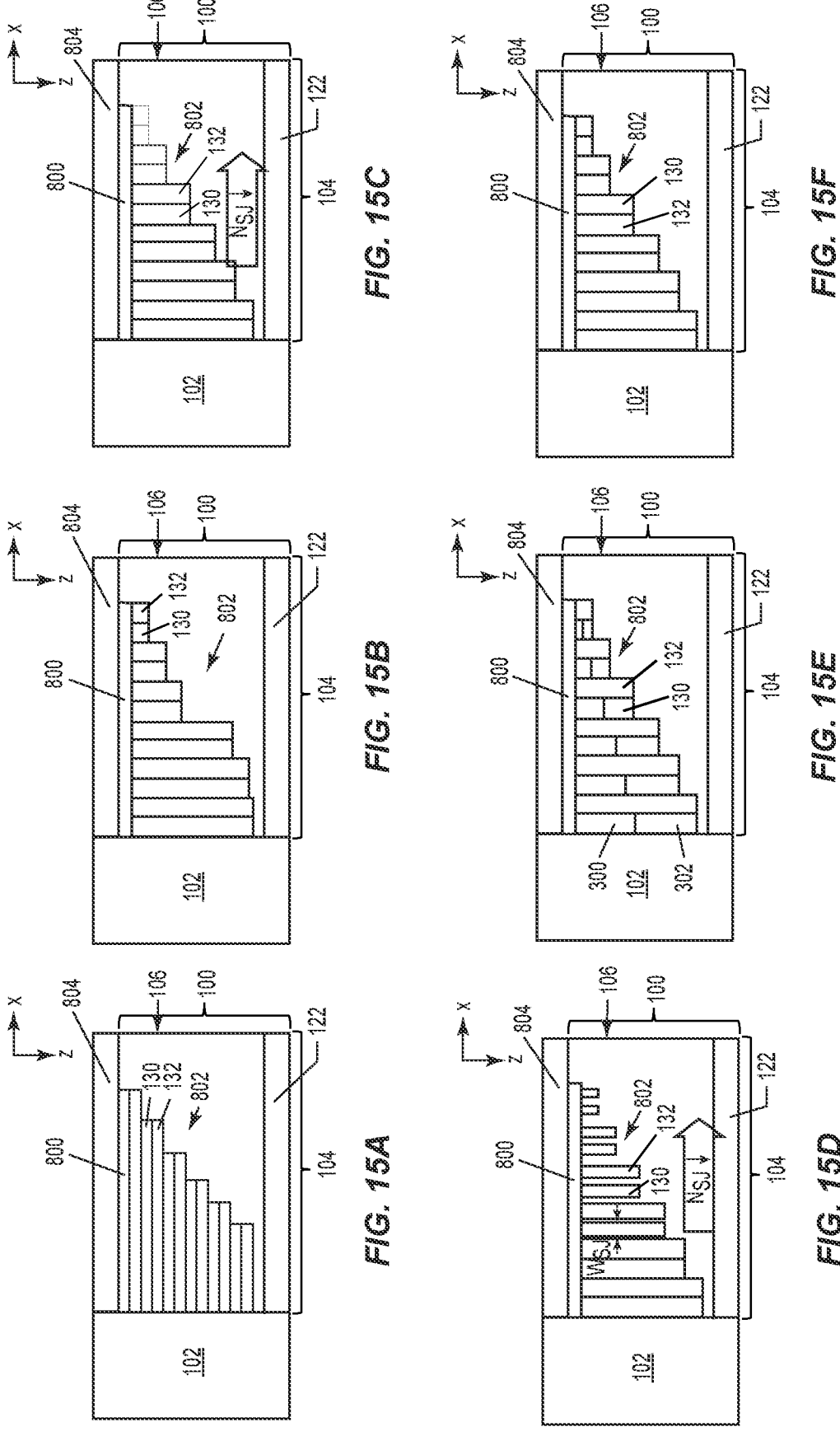
FIGS. 15A through 15F illustrate respective cross-sectional views of additional embodiments of the staircase-shaped superjunction structure in the termination region of the device of FIG. 12.

FIG. 15A shows the staircase-shaped SJ structure 802 implemented as a lateral structure instead of a vertical structure. That is, the SJ columns 130, 132 of the opposite conductivity types alternate in a vertical direction (z direction in FIG. 15A) instead of a horizontal direction as shown in FIG. 12.

FIG. 15B shows the height/depth ($L_{SJ}$) of the SJ columns 130, 132 that decreases by a variable amount in a horizontal direction (x direction in FIG. 15B) towards the edge 106 of the SiC substrate 100 instead of by the same fixed amount as shown in FIG. 12.

FIG. 15C shows the average doping concentration '$N_{SJ}$' of the SJ columns decreasing in a horizontal direction (x direction in FIG. 15C) towards the edge 106 of the SiC substrate 100.

FIG. 15D shows the width '$W_{SJ}$' of the SJ columns 130, 132 decreasing in a horizontal direction (x direction in FIG. 15D) towards the edge 106 of the SiC substrate 100.

FIG. 15E shows one or both types of the SJ columns 130, 132 having a doping 'N$_{SJ}$' that is nonuniform in a vertical direction (z direction in FIG. 15E) of the SiC substrate 100. A non-uniform SJ doping profile may be used to achieve a better stability of the breakdown voltage against charge imbalance. For example, tapered SJ columns 130, 132 or SJ columns 130 of the first conductivity type and with a larger doping in the upper half and a lower doping in the lower half may be used in the termination region 104.

FIG. 15F shows the order of SJ columns 130, 132 of the opposite conductivity types reversed compared to the implementation in FIG. 12. Accordingly, an SJ column 130 of the first conductivity type is the outermost column of the staircase-shaped SJ structure 802. This configuration helps to reshape the distribution of the electric field and improve the stability of the breakdown voltage.

Although the present disclosure is not so limited, the following numbered examples demonstrate one or more aspects of the disclosure.

Example 1. A semiconductor device, comprising: a semiconductor substrate having an active device region that includes a plurality of device cells and a termination region between the active device region and an edge of the semiconductor substrate; a field termination structure in the termination region and comprising a continuous region of a first conductivity type and a plurality of rings of the first conductivity type in the continuous region and having a higher average doping concentration than the continuous region; and a charge balance structure in the active device region and comprising interleaved columns of the first conductivity type and of a second conductivity type opposite the first conductivity type, wherein the charge balance structure extends into the termination region below the field termination structure such that at least an outermost one of the columns of the first conductivity type is connected to the continuous region of the field termination structure.

Example 2. The semiconductor device of example 1, wherein a first subset of the plurality of rings of the first conductivity type is positioned between the active device region and a second subset of the plurality of rings of the first conductivity type, wherein the second subset of the plurality of rings of the first conductivity type is positioned between the first subset of the plurality of rings of the first conductivity type and the edge of the semiconductor substrate, and wherein the charge balance structure extends into the termination region below the first subset of the plurality of rings of the first conductivity type but not below the second subset of the plurality of rings of the first conductivity type.

Example 3. The semiconductor device of example 2, wherein the interleaved columns of the charge balance structure disposed below the first subset of the plurality of rings of the first conductivity type in the termination region have the same spacing and the same vertical and horizontal dimensions as the interleaved columns of the charge balance structure disposed in the active device region.

Example 4. The semiconductor device of example 2, wherein at least some of the columns of the first conductivity type of the charge balance structure disposed below the first subset of the plurality of rings of the first conductivity type in the termination region have a different width and/or depth as the columns of the first conductivity type of the charge balance structure disposed in the active device region.

Example 5. The semiconductor device of any of examples 1 through 4, wherein for a first rectilinear part of the termination region, the interleaved columns of the charge balance structure run parallel to the rings of the field termination structure, wherein for a second rectilinear part of the termination region, the interleaved columns of the charge balance structure run transverse to the rings of the field termination structure, and wherein for a corner part of the termination region connects that adjoins the first and second rectilinear parts, the interleaved columns of the charge balance structure run transverse to the rings of the field termination structure.

Example 6. The semiconductor device of any of examples 1 through 5, wherein the charge balance structure extends to an outer edge of the field termination structure.

Example 7. The semiconductor device of example 1, wherein the continuous region and the plurality of rings of the first conductivity type terminate at a same depth in the semiconductor substrate.

Example 8. The semiconductor device of any of examples 1 through 7, wherein the continuous region extends deeper into the semiconductor substrate than the plurality of rings of the first conductivity type.

Example 9. The semiconductor device of example 8, wherein the field termination structure comprises a plurality of rings of the second conductivity type in the continuous region and interleaved with the plurality of rings of the first conductivity type.

Example 10. The semiconductor device of example 8 or 9, wherein the continuous region connects each column of the first conductivity type in the termination region to the plurality of rings of the first conductivity type.

Example 11. The semiconductor device of any of examples 1 through 10, wherein a width and/or an average doping concentration of the plurality of rings of the first conductivity type decreases in a horizontal direction heading towards the edge of the semiconductor substrate.

Example 12. The semiconductor device of any of examples 1 through 11, wherein an average doping concentration of the plurality of rings of the first conductivity type is greater than an average doping concentration of the columns of the first conductivity type.

Example 13. The semiconductor device of any of examples 1 through 12, wherein a plurality of the columns of the first conductivity type are disposed below the field termination structure and electrically connected to the plurality of the rings of the first conductivity type.

Example 14. The semiconductor device of example 13, wherein a depth of the plurality of the columns of the first conductivity type disposed below the field termination structure decreases in a horizontal direction heading towards the edge of the semiconductor substrate.

Example 15. The semiconductor device of example 13 or 14, wherein a width and/or an average doping concentration of the plurality of the columns of the first conductivity type disposed below the field termination structure decreases in a horizontal direction heading towards the edge of the semiconductor substrate.

Example 16. The semiconductor device of any of examples 1 through 15, wherein the semiconductor substrate is a SiC substrate.

Example 17. The semiconductor device of any of examples 1 through 16, further comprising a transition region of the first conductivity type between the active device region and the termination region, wherein the transition region has a higher average doping concentration than both the continuous region of the field termination structure and the columns of the first conductivity type, wherein the charge balance structure extends below the transition region and into the termination region, and wherein the columns of the first conductivity type disposed below the transition region are connected to the transition region.

Example 18. The semiconductor device of any of examples 1 through 17, wherein the columns of the first and/or second conductivity type in the active device region have a different doping profile than each column of the same conductivity type disposed below the field termination structure.

Example 19. The semiconductor device of any of examples 1 through 18, wherein an upper part of the columns of the first conductivity type are doped more heavily than an adjacent upper part of the columns of the second conductivity type, and wherein a lower part of the columns of the first conductivity type are doped more lightly than an adjacent lower part of the columns of the second conductivity type.

Example 20. A method of producing a semiconductor device, the method comprising: forming a plurality of device cells in an active device region of a semiconductor substrate, the semiconductor substrate also having a termination region between the active device region and an edge of the semiconductor substrate; forming a field termination structure in the termination region and comprising a continuous region of a first conductivity type and a plurality of rings of the first conductivity type in the continuous region and having a higher average doping concentration than the continuous region; and forming a charge balance structure in the active device region and comprising interleaved columns of the first conductivity type and of a second conductivity type opposite the first conductivity type, the charge balance structure extending into the termination region below the field termination structure such that at least an outermost one of the columns of the first conductivity type is connected to the continuous region of the field termination structure.

Example 21. A semiconductor device, comprising: a SiC substrate having an active device region that includes a plurality of device cells and a termination region between the active device region and an edge of the SiC substrate; a junction termination extension of a first conductivity type in the termination region; and a charge balance structure in the active device region and comprising interleaved columns of the first conductivity type and of a second conductivity type opposite the first conductivity type, wherein the charge balance structure extends into the termination region below the junction termination extension, wherein a depth of the interleaved columns of the charge balance structure disposed below the junction termination extension decreases in a horizontal direction heading towards the edge of the SiC substrate.

Terms such as "first", "second", and the like, are used to describe various elements, regions, sections, etc. and are also not intended to be limiting. Like terms refer to like elements throughout the description.

The expression "and/or" should be interpreted to mean all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor substrate having an active device region that includes a plurality of device cells and a termination region between the active device region and an edge of the semiconductor substrate;
a field termination structure in the termination region and comprising a continuous region of a first conductivity type and a plurality of rings of the first conductivity type in the continuous region and having a higher average doping concentration than the continuous region; and
a charge balance structure in the active device region and comprising interleaved columns of the first conductivity type and of a second conductivity type opposite the first conductivity type,
wherein the charge balance structure extends into the termination region below the field termination structure such that at least an outermost one of the columns of the first conductivity type is connected to the continuous region of the field termination structure,
wherein a first subset of the plurality of rings of the first conductivity type is positioned between the active device region and a second subset of the plurality of rings of the first conductivity type,
wherein the second subset of the plurality of rings of the first conductivity type is positioned between the first subset of the plurality of rings of the first conductivity type and the edge of the semiconductor substrate,
wherein the charge balance structure extends into the termination region below the first subset of the plurality of rings of the first conductivity type but not below the second subset of the plurality of rings of the first conductivity type.

2. The semiconductor device of claim 1, wherein the interleaved columns of the charge balance structure disposed below the first subset of the plurality of rings of the first conductivity type in the termination region have the same spacing and the same vertical and horizontal dimensions as the interleaved columns of the charge balance structure disposed in the active device region.

3. The semiconductor device of claim 1, wherein at least some of the columns of the first conductivity type of the charge balance structure disposed below the first subset of the plurality of rings of the first conductivity type in the termination region have a different width and/or depth as the columns of the first conductivity type of the charge balance structure disposed in the active device region.

4. The semiconductor device of claim 1, wherein for a first rectilinear part of the termination region, the interleaved columns of the charge balance structure run parallel to the rings of the field termination structure, wherein for a second rectilinear part of the termination region, the interleaved columns of the charge balance structure run transverse to the rings of the field termination structure, and a corner part of the termination region connects the first and second rectilinear parts.

5. The semiconductor device of claim 1, wherein the charge balance structure extends to an outer edge of the field termination structure.

6. The semiconductor device of claim 1, wherein the continuous region and the plurality of rings of the first conductivity type terminate at a same depth in the semiconductor substrate.

7. The semiconductor device of claim 1, wherein the continuous region extends deeper into the semiconductor substrate than the plurality of rings of the first conductivity type.

8. The semiconductor device of claim 7, wherein the field termination structure comprises a plurality of rings of the second conductivity type in the continuous region and interleaved with the plurality of rings of the first conductivity type.

9. The semiconductor device of claim 7, wherein the continuous region connects each column of the first conductivity type in the termination region to the plurality of rings of the first conductivity type.

10. The semiconductor device of claim 1, wherein a width and/or an average doping concentration of the plurality of rings of the first conductivity type decreases in a horizontal direction heading towards the edge of the semiconductor substrate.

11. The semiconductor device of claim 1, wherein an average doping concentration of the plurality of rings of the first conductivity type is greater than an average doping concentration of the columns of the first conductivity type.

12. The semiconductor device of claim 1, wherein a plurality of the columns of the first conductivity type are disposed below the field termination structure and electrically connected to the plurality of the rings of the first conductivity type.

13. The semiconductor device of claim 12, wherein a depth of the plurality of the columns of the first conductivity type disposed below the field termination structure decreases in a horizontal direction heading towards the edge of the semiconductor substrate.

14. The semiconductor device of claim 12, wherein a width and/or an average doping concentration of the plurality of the columns of the first conductivity type disposed below the field termination structure decreases in a horizontal direction heading towards the edge of the semiconductor substrate.

15. The semiconductor device of claim 1, wherein the semiconductor substrate is a SiC substrate.

16. The semiconductor device of claim 1, further comprising a transition region of the first conductivity type between the active device region and the termination region, wherein the transition region has a higher average doping concentration than both the continuous region of the field termination structure and the columns of the first conductivity type, wherein the charge balance structure extends below the transition region and into the termination region, and wherein the columns of the first conductivity type disposed below the transition region are connected to the transition region.

17. The semiconductor device of claim 1, wherein the columns of the first and/or second conductivity type in the active device region have a different doping profile than each column of the same conductivity type disposed below the field termination structure.

18. The semiconductor device of claim 1, wherein an upper part of the columns of the first conductivity type are doped more heavily than an adjacent upper part of the columns of the second conductivity type, and wherein a lower part of the columns of the first conductivity type are doped more lightly than an adjacent lower part of the columns of the second conductivity type.

19. A semiconductor device, comprising:

a SiC substrate having an active device region that includes a plurality of device cells and a termination region between the active device region and an edge of the SiC substrate;

a junction termination extension of a first conductivity type in the termination region; and a charge balance structure in the active device region and comprising interleaved columns of the first conductivity type and of a second conductivity type opposite the first conductivity type, wherein the charge balance structure extends into the termination region below the junction termination extension, wherein a depth of the interleaved columns of the charge balance structure disposed below the junction termination extension decreases in a horizontal direction heading towards the edge of the SiC substrate.

20. A semiconductor device, comprising:

a semiconductor substrate having an active device region that includes a plurality of device cells and a termination region between the active device region and an edge of the semiconductor substrate;

a field termination structure in the termination region and comprising a continuous region of a first conductivity type and a plurality of rings of the first conductivity type in the continuous region and having a higher average doping concentration than the continuous region; and a charge balance structure in the active device region and comprising interleaved columns of the first conductivity type and of a second conductivity type opposite the first conductivity type, wherein the charge balance structure extends into the termination region below the field termination structure such that at least an outermost one of the columns of the first conductivity type is connected to the continuous region of the field termination structure, wherein the continuous region extends deeper into the semiconductor substrate than the plurality of rings of the first conductivity type, wherein the field termination structure comprises a plurality of rings of the second conductivity type in the continuous region and interleaved with the plurality of rings of the first conductivity type.

21. A semiconductor device, comprising:

a semiconductor substrate having an active device region that includes a plurality of device cells and a termination region between the active device region and an edge of the semiconductor substrate;

a field termination structure in the termination region and comprising a continuous region of a first conductivity type and a plurality of rings of the first conductivity type in the continuous region and having a higher average doping concentration than the continuous region; and a charge balance structure in the active device region and comprising interleaved columns of the first conductivity type and of a second conductivity type opposite the first conductivity type, wherein the charge balance structure extends into the termination region below the field termination structure such that at least an outermost one of the columns of the first conductivity type is connected to the continuous region of the field termination structure, wherein a plurality of the columns of the first conductivity type are disposed below the field termination structure and electrically connected to the plurality of the rings of the first conductivity type, wherein a width and/or an average doping concentration of the plurality of the columns of the first conductivity type disposed below the field termination structure decreases in a horizontal direction heading towards the edge of the semiconductor substrate.

22. A semiconductor device, comprising:

a semiconductor substrate having an active device region that includes a plurality of device cells and a termination region between the active device region and an edge of the semiconductor substrate;

a field termination structure in the termination region and comprising a continuous region of a first conductivity type and a plurality of rings of the first conductivity type in the continuous region and having a higher average doping concentration than the continuous region; and a charge balance structure in the active device region and comprising interleaved columns of the first conductivity type and of a second conductivity type opposite the first conductivity type, wherein the charge balance structure extends into the termination region below the field termination structure such that at least an outermost one of the columns of the first conductivity type is connected to the continuous region of the field termination structure, wherein the columns of the first and/or second conductivity type in the active device region have a different doping profile than each column of the same conductivity type disposed below the field termination structure.

23. A semiconductor device, comprising:

a semiconductor substrate having an active device region that includes a plurality of device cells and a termination region between the active device region and an edge of the semiconductor substrate;

a field termination structure in the termination region and comprising a continuous region of a first conductivity type and a plurality of rings of the first conductivity type in the continuous region and having a higher average doping concentration than the continuous region; and a charge balance structure in the active device region and comprising interleaved columns of the first conductivity type and of a second conductivity type opposite the first conductivity type, wherein the charge balance structure extends into the termination region below the field termination structure such that at least an outermost one of the columns of the first conductivity type is connected to the continuous region of the field termination structure, wherein an upper part of the columns of the first conductivity type are doped more heavily than an adjacent upper part of the columns of the second conductivity type, wherein a lower part of the columns of the first conductivity type are doped more lightly than an adjacent lower part of the columns of the second conductivity type.

* * * * *